(12) United States Patent
Yang

(10) Patent No.: US 11,615,839 B2
(45) Date of Patent: Mar. 28, 2023

(54) NON-VOLATILE MEMORY WITH VARIABLE BITS PER MEMORY CELL

(71) Applicant: SANDISK TECHNOLOGIES LLC, Addison, TX (US)

(72) Inventor: Xiang Yang, Santa Clara, CA (US)

(73) Assignee: SANDISK TECHNOLOGIES LLC, Addison, TX (US)

(*) Notice: Subject to any disclaimer, the term of this patent is extended or adjusted under 35 U.S.C. 154(b) by 121 days.

(21) Appl. No.: 17/368,727

(22) Filed: Jul. 6, 2021

(65) Prior Publication Data

US 2023/0012977 A1    Jan. 19, 2023

(51) Int. Cl.
  *G11C 16/04*      (2006.01)
  *G11C 11/56*      (2006.01)
  *G11C 16/08*      (2006.01)
  *G11C 16/10*      (2006.01)
  *G11C 16/26*      (2006.01)
  *H01L 27/11565*   (2017.01)
  *H01L 25/065*     (2023.01)
  *H01L 27/11582*   (2017.01)

(52) U.S. Cl.
  CPC ...... *G11C 11/5671* (2013.01); *G11C 16/0483* (2013.01); *G11C 16/08* (2013.01); *G11C 16/10* (2013.01); *G11C 16/26* (2013.01); *H01L 25/0657* (2013.01); *H01L 27/11565* (2013.01); *H01L 27/11582* (2013.01); *H01L 2225/06562* (2013.01)

(58) Field of Classification Search
  CPC .................. G11C 16/0483; G11C 16/3454
  See application file for complete search history.

(56) References Cited

U.S. PATENT DOCUMENTS

| 7,180,775 | B2 | 2/2007 | Meir |
| 7,508,732 | B2 | 3/2009 | Park |
| 8,144,505 | B2 | 3/2012 | Lee |
| 9,286,987 | B1* | 3/2016 | Dong ................. G11C 16/3427 |
| 10,748,619 | B1 | 8/2020 | Li |
| 2008/0198651 | A1 | 8/2008 | Kim |
| 2016/0342344 | A1 | 11/2016 | Kankani et al. |
| 2020/0388338 | A1 | 12/2020 | Yang et al. |

OTHER PUBLICATIONS

PCT International Search Report and Written Opinion dated Nov. 24, 2022, PCT Patent Application No. PCT/US2022/027236.

* cited by examiner

*Primary Examiner* — Jason Lappas
(74) *Attorney, Agent, or Firm* — Vierra Magen Marcus LLP

(57) ABSTRACT

In a three dimensional non-volatile memory structure that etches part of the top of the memory structure (including a portion of the select gates), data is stored on a majority (or all but one) of the word lines as x bits per memory cell while data is stored on a top edge word line that is closest to the etching with variable bits per memory cell. In one example embodiment that implements vertical NAND strings, memory cells connected to the top edge word line and that are on NAND strings adjacent the etching store data as n bits per memory cell and memory cells connected to the top edge word line and that are on NAND strings not adjacent the etching store data as m bits per memory cell, where m>x>n.

20 Claims, 26 Drawing Sheets

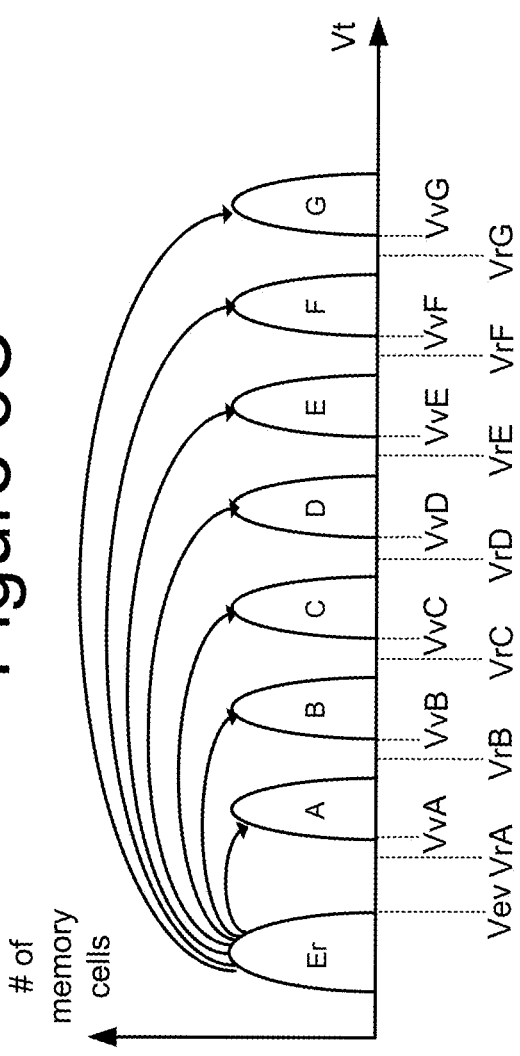
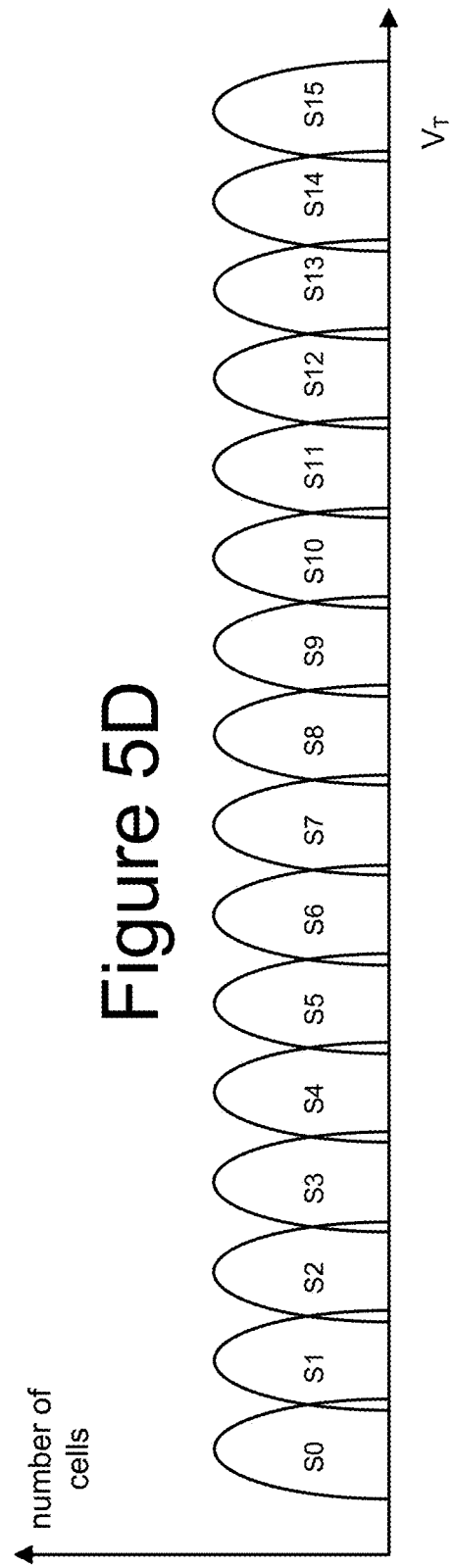

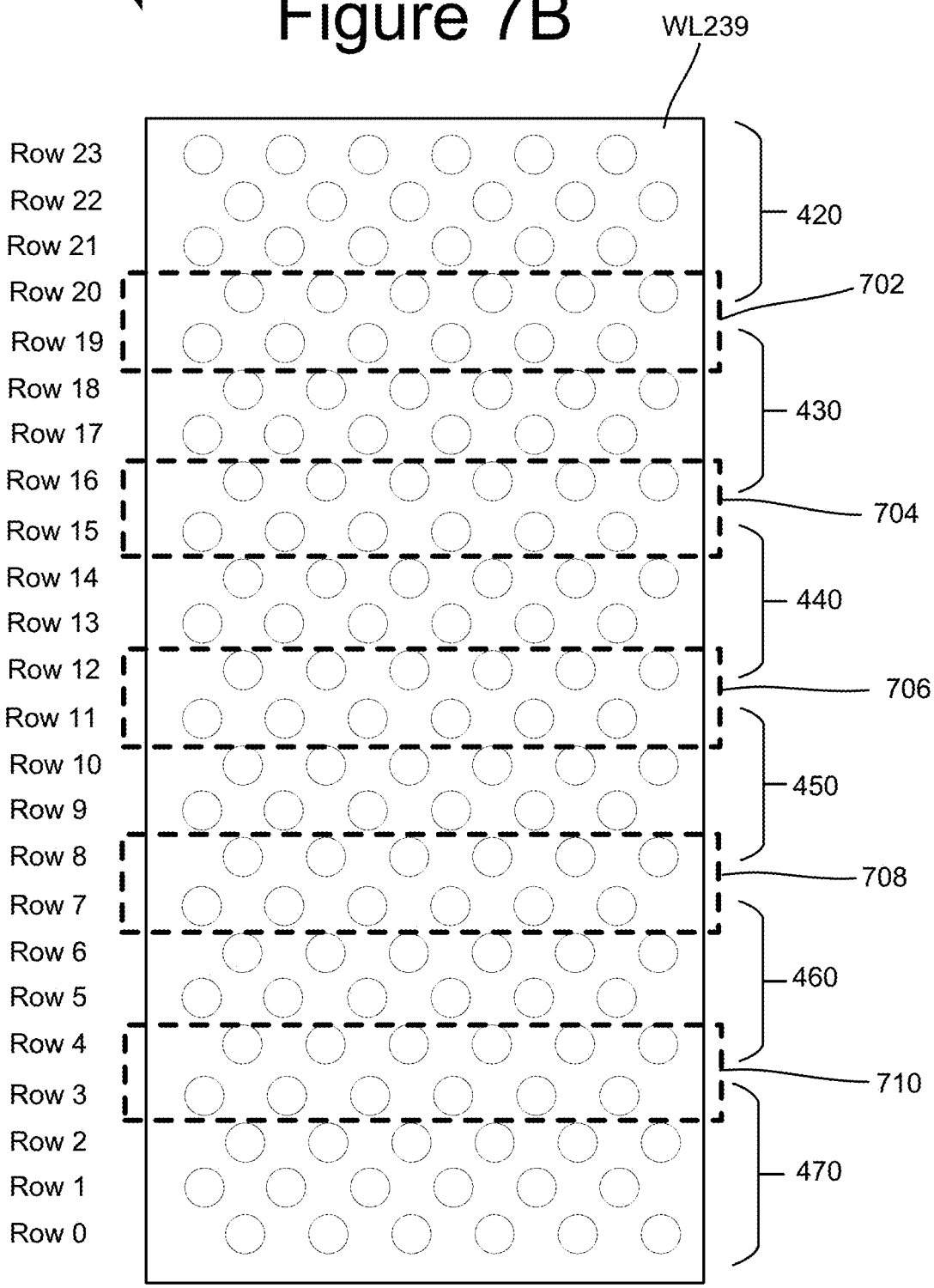

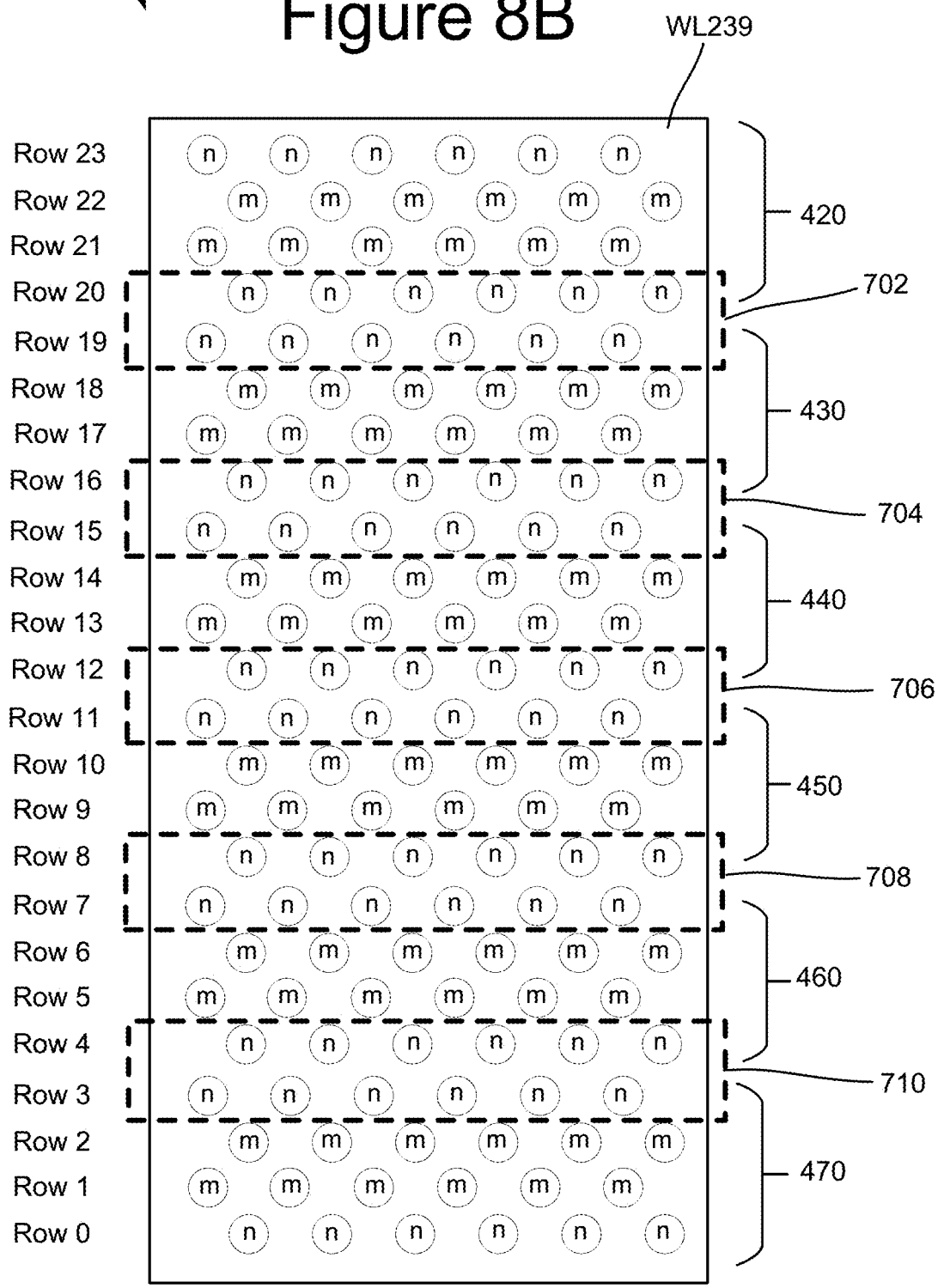

Table A: WL238

|     | BL0 | BL1 | BL2 | BL3 | BL4 | BL5 | BL6 | BL7 | BL8 | BL9 | BL10 | BL11 | BL12 | BL13 | BL14 | BL15 |
|-----|-----|-----|-----|-----|-----|-----|-----|-----|-----|-----|------|------|------|------|------|------|
| ADL | LP  | lp  | lp  | LP  | LP  | lp  | lp  | LP  | LP  | lp  | lp   | LP   | LP   | lp   | lp   | LP   |
| BDL | MP  | mp  | mp  | MP  | MP  | mp  | mp  | MP  | MP  | mp  | mp   | MP   | MP   | mp   | mp   | MP   |
| CDL | UP  | up  | up  | UP  | UP  | up  | up  | UP  | UP  | up  | up   | UP   | UP   | up   | up   | UP   |
| XDL |     |     |     |     |     |     |     |     |     |     |      |      |      |      |      |      |

Table B: WL239

|     | BL0 | BL1 | BL2 | BL3 | BL4 | BL5 | BL6 | BL7 | BL8 | BL9 | BL10 | BL11 | BL12 | BL13 | BL14 | BL15 |
|-----|-----|-----|-----|-----|-----|-----|-----|-----|-----|-----|------|------|------|------|------|------|
| ADL | LP  | lp  | lp  | LP  | LP  | lp  | lp  | LP  | LP  | lp  | lp   | LP   | LP   | lp   | lp   | LP   |
| BDL | MP  | mp  | mp  | MP  | MP  | mp  | mp  | MP  | MP  | mp  | mp   | MP   | MP   | mp   | mp   | MP   |
| CDL | UP  |     |     | UP  | UP  |     |     | UP  | UP  |     |      | UP   | UP   |      |      | UP   |
| XDL |     | up  | up  |     |     | up  | up  |     |     | up  | up   |      |      | up   | up   |      |

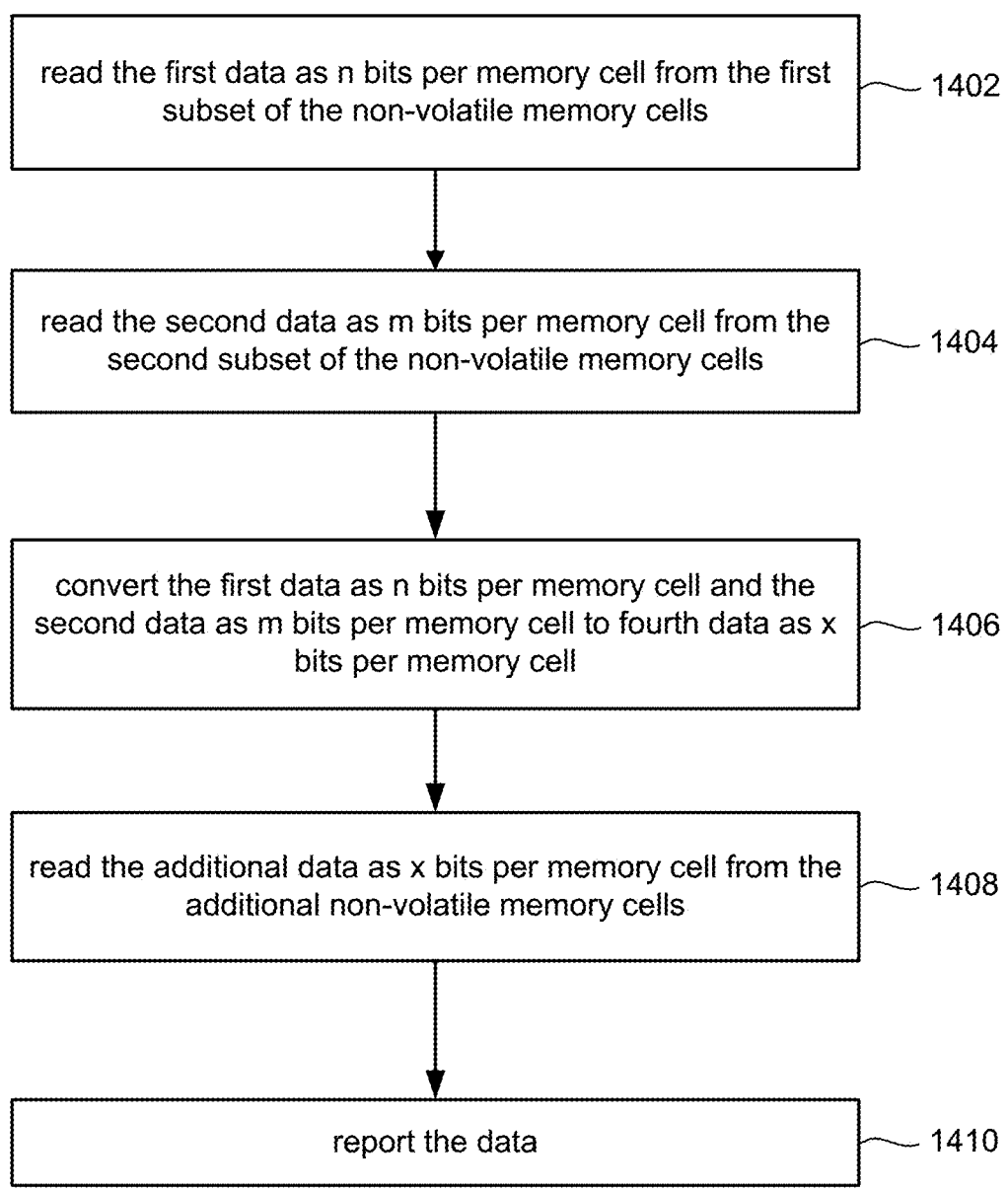

NON-VOLATILE MEMORY WITH VARIABLE BITS PER MEMORY CELL

BACKGROUND

The present disclosure relates to non-volatile storage.

Semiconductor memory is widely used in various electronic devices such as cellular telephones, digital cameras, personal digital assistants, medical electronics, mobile computing devices, servers, solid state drives, non-mobile computing devices and other devices. Semiconductor memory may comprise non-volatile memory or volatile memory. Non-volatile memory allows information to be stored and retained even when the non-volatile memory is not connected to a source of power (e.g., a battery). One example of non-volatile memory is flash memory (e.g., NAND-type and NOR-type flash memory).

Users of non-volatile memory can program (e.g., write) data to the non-volatile memory and later read that data back. For example, a digital camera may take a photograph and store the photograph in non-volatile memory. Later, a user of the digital camera may view the photograph by having the digital camera read the photograph from the non-volatile memory. Because users often rely on the data they store, it is important to users of non-volatile memory to be able to store data reliably so that it can be read back successfully.

BRIEF DESCRIPTION OF THE DRAWINGS

Like-numbered elements refer to common components in the different figures.

FIG. 5C depicts threshold voltage distributions.
FIG. 5D depicts threshold voltage distributions.

FIG. 7B depicts a top view of a top edge word line layer of a portion of one embodiment of a block of memory cells.
FIG. 8B depicts a top view of a top edge word line layer of a portion of one embodiment of a block of memory cells.
FIG. 14 is a flow chart describing one embodiment of a process for reading data.

DETAILED DESCRIPTION

Some memory system implement a three dimensional non-volatile memory structure. In order to isolate portions of the memory structure to enable separate addressing of subsets of the memory (or for other reasons), the memory structure will be etched and the removed portions of the memory structure due to the etch are filled in with a dielectric material. However, this etching can diminish the ability of the memory structure to store data reliably at locations near the etching. Therefore, it is proposed to store data for a majority of the word lines as x bits per memory cell, while memory cells connected to a top/edge word line that is closest to the etching will store data with variable bits per memory cell. The uses of variable bits per memory cell compensates for any reduction in reliability due to the etching. In one embodiment that implements vertical NAND strings, memory cells connected to the top/edge word line and that are on NAND strings adjacent to the etching store data as n bits per memory cell and memory cells connected to the top edge word line and that are on NAND strings not adjacent to the etching store data as m bits per memory cell, where m>x>n.

On embodiment comprises a plurality of non-volatile memory cells arranged as groups of connected non-volatile memory cells, a plurality of word lines connected to the groups of connected non-volatile memory cells and a control circuit connected to the non-volatile memory cells and the word lines. The control circuit is configured to program first data as n bits per memory cell to a first subset of the non-volatile memory cells that are connected to a first word line of the plurality of word lines, program second data as m bits per memory cell to a second subset of the non-volatile memory cells that are connected to the first word line of the plurality of word lines, and program additional data as x bits per memory cell to non-volatile memory cells connected to the other word lines.

Figure 1:
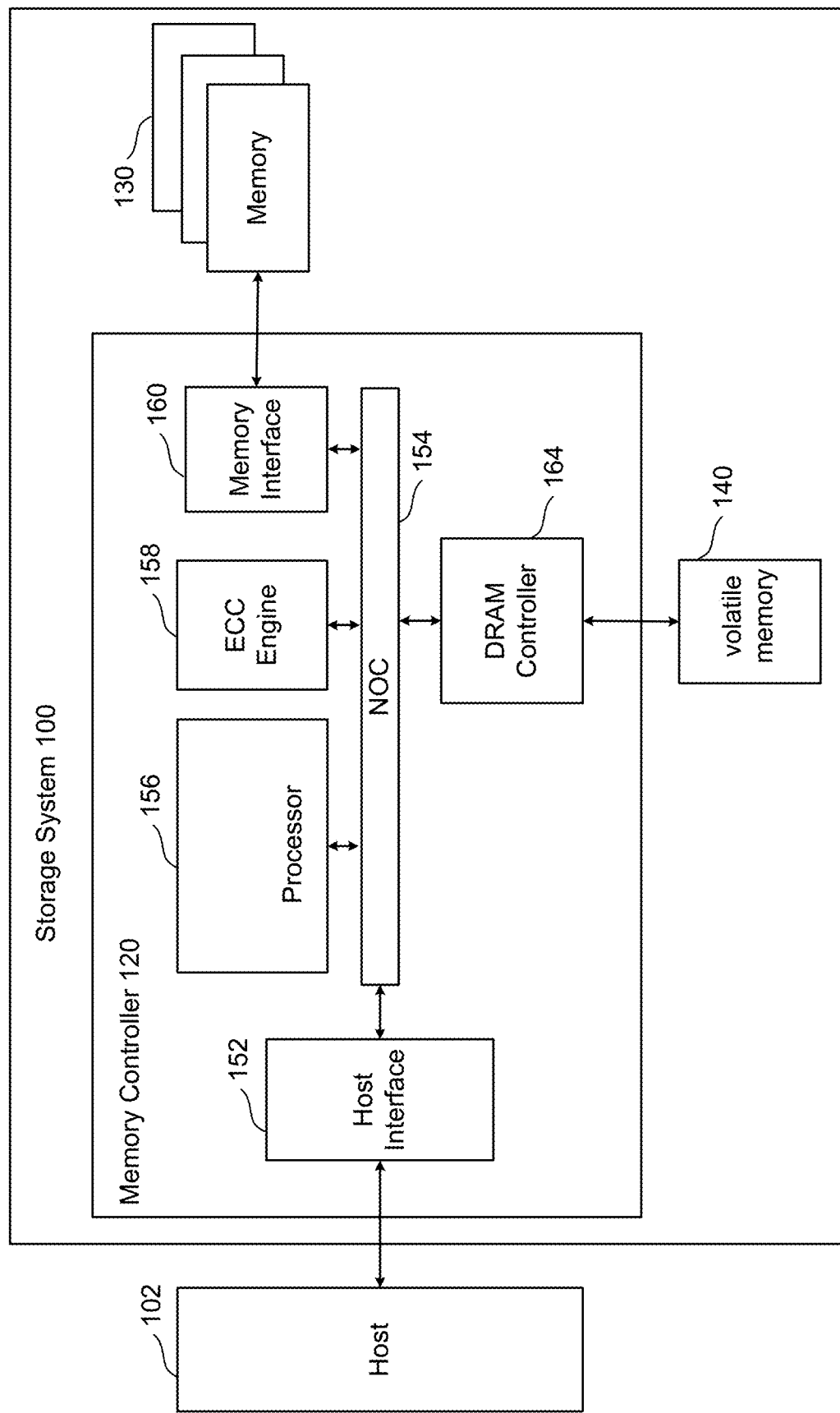
FIG. 1 is a block diagram depicting one embodiment of a storage system.

FIG. 1 is a block diagram of one embodiment of a storage system 100 that implements the proposed technology described herein. In one embodiment, storage system 100 is a solid state drive ("SSD"). Storage system 100 can also be a memory card, USB drive or other type of storage system.

The proposed technology is not limited to any one type of memory system. Storage system 100 is connected to host 102, which can be a computer, server, electronic device (e.g., smart phone, tablet or other mobile device), appliance, or another apparatus that uses memory and has data processing capabilities. In some embodiments, host 102 is separate from, but connected to, storage system 100. In other embodiments, storage system 100 is embedded within host 102.

The components of storage system 100 depicted in FIG. 1 are electrical circuits. Storage system 100 includes a memory controller 120 connected to non-volatile memory 130 and local high speed volatile memory 140 (e.g., DRAM). Local high speed volatile memory 140 is used by memory controller 120 to perform certain functions. For example, local high speed volatile memory 140 stores logical to physical address translation tables ("L2P tables").

Memory controller 120 comprises a host interface 152 that is connected to and in communication with host 102. In one embodiment, host interface 152 implements a NVM Express (NVMe) over PCI Express (PCIe). Other interfaces can also be used, such as SCSI, SATA, etc. Host interface 152 is also connected to a network-on-chip (NOC) 154. A NOC is a communication subsystem on an integrated circuit. NOC's can span synchronous and asynchronous clock domains or use unclocked asynchronous logic. NOC technology applies networking theory and methods to on-chip communications and brings notable improvements over conventional bus and crossbar interconnections. NOC improves the scalability of systems on a chip (SoC) and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). In other embodiments, NOC 154 can be replaced by a bus. Connected to and in communication with NOC 154 is processor 156, ECC engine 158, memory interface 160, and DRAM controller 164. DRAM controller 164 is used to operate and communicate with local high speed volatile memory 140 (e.g., DRAM). In other embodiments, local high speed volatile memory 140 can be SRAM or another type of volatile memory.

ECC engine 158 performs error correction services. For example, ECC engine 158 performs data encoding and decoding, as per the implemented ECC technique. In one embodiment, ECC engine 158 is an electrical circuit programmed by software. For example, ECC engine 158 can be a processor that can be programmed. In other embodiments, ECC engine 158 is a custom and dedicated hardware circuit without any software. In another embodiment, the function of ECC engine 158 is implemented by processor 156.

Processor 156 performs the various controller memory operations, such as programming, erasing, reading, and memory management processes. In one embodiment, processor 156 is programmed by firmware. In other embodiments, processor 156 is a custom and dedicated hardware circuit without any software. Processor 156 also implements a translation module, as a software/firmware process or as a dedicated hardware circuit. In many systems, the non-volatile memory is addressed internally to the storage system using physical addresses associated with the one or more memory die. However, the host system will use logical addresses to address the various memory locations. This enables the host to assign data to consecutive logical addresses, while the storage system is free to store the data as it wishes among the locations of the one or more memory die. To implement this system, memory controller 120 (e.g., the translation module) performs address translation between the logical addresses used by the host and the physical addresses used by the memory dies. One example implementation is to maintain tables (i.e. the L2P tables mentioned above) that identify the current translation between logical addresses and physical addresses. An entry in the L2P table may include an identification of a logical address and corresponding physical address. Although logical address to physical address tables (or L2P tables) include the word "tables" they need not literally be tables. Rather, the logical address to physical address tables (or L2P tables) can be any type of data structure. In some examples, the memory space of a storage system is so large that the local memory 140 cannot hold all of the L2P tables. In such a case, the entire set of L2P tables are stored in a memory die 130 and a subset of the L2P tables are cached (L2P cache) in the local high speed volatile memory 140.

Memory interface 160 communicates with non-volatile memory 130. In one embodiment, memory interface provides a Toggle Mode interface. Other interfaces can also be used. In some example implementations, memory interface 160 (or another portion of controller 120) implements a scheduler and buffer for transmitting data to and receiving data from one or more memory die.

Figure 2A:
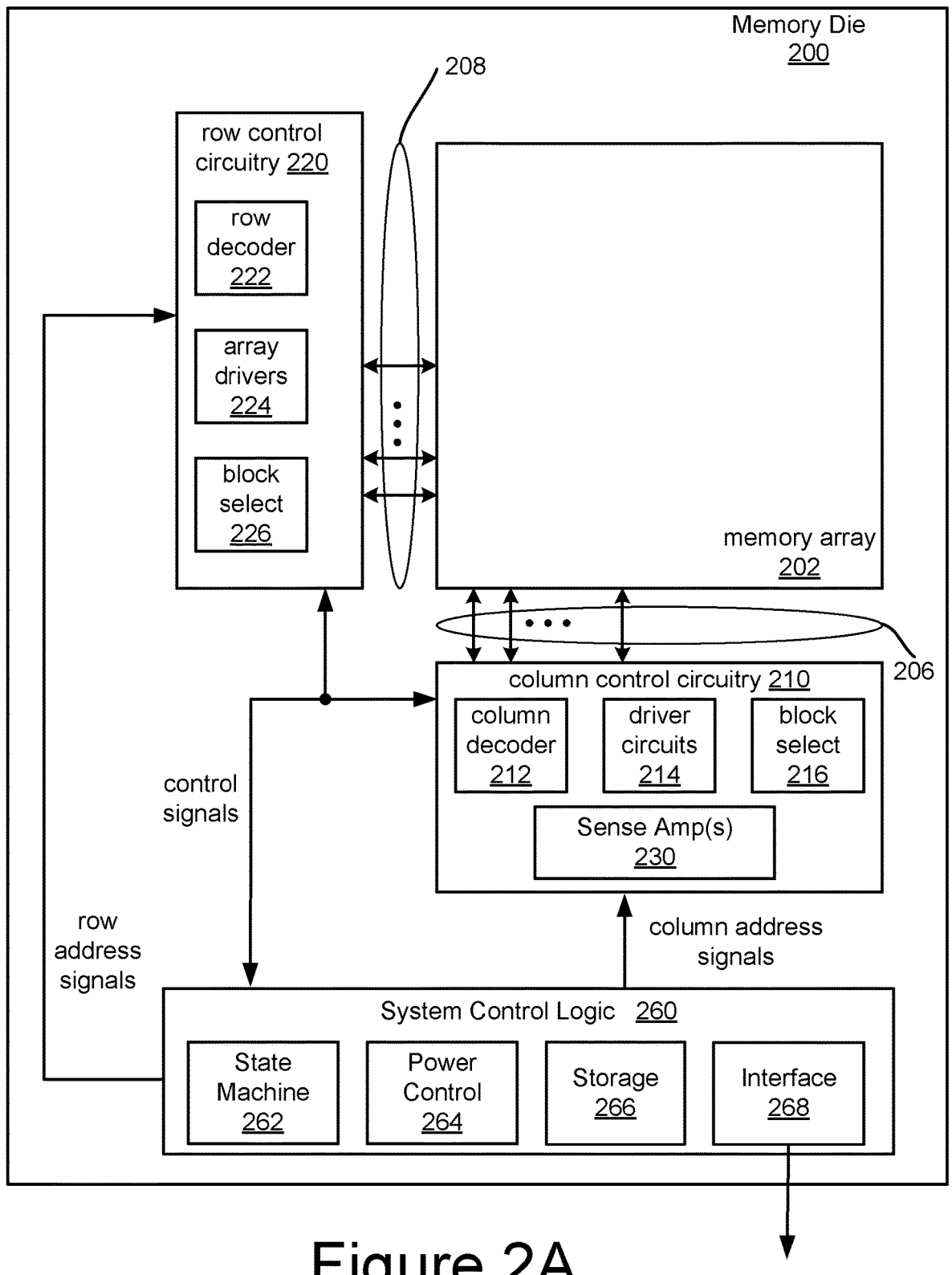
FIG. 2A is a block diagram of one embodiment of a memory die.

In one embodiment, non-volatile memory 130 comprises one or more memory die. FIG. 2A is a functional block diagram of one embodiment of a memory die 200 that comprises non-volatile memory 130. Each of the one or more memory die of non-volatile memory 130 can be implemented as memory die 200 of FIG. 2A. The components depicted in FIG. 2A are electrical circuits. Memory die 200 includes a memory array 202 that can comprises non-volatile memory cells, as described in more detail below. The array terminal lines of memory array 202 include the various layer(s) of word lines organized as rows, and the various layer(s) of bit lines organized as columns. However, other orientations can also be implemented. Memory die 200 includes row control circuitry 220, whose outputs 208 are connected to respective word lines of the memory array 202. Row control circuitry 220 receives a group of M row address signals and one or more various control signals from System Control Logic circuit 206, and typically may include such circuits as row decoders 222, array terminal drivers 224, and block select circuitry 226 for both reading and writing (programming) operations. Row control circuitry 220 may also include read/write circuitry. Memory die 200 also includes column control circuitry 210 including sense amplifier(s) 230 whose input/outputs 206 are connected to respective bit lines of the memory array 202. Although only single block is shown for array 202, a memory die can include multiple arrays that can be individually accessed. Column control circuitry 210 receives a group of N column address signals and one or more various control signals from System Control Logic 260, and typically may include such circuits as column decoders 212, array terminal receivers or driver circuits 214, block select circuitry 216, as well as read/write circuitry, and I/O multiplexers.

System control logic 260 receives data and commands from memory controller 120 and provides output data and status to the host. In some embodiments, the system control logic 260 (which comprises one or more electrical circuits) include state machine 262 that provides die-level control of memory operations. In one embodiment, the state machine 262 is programmable by software. In other embodiments, the state machine 262 does not use software and is completely implemented in hardware (e.g., electrical circuits). In another embodiment, the state machine 262 is replaced by a micro-controller or microprocessor, either on or off the memory chip. System control logic 262 can also include a power control module 264 that controls the power and voltages supplied to the rows and columns of the memory structure 202 during memory operations and may include charge pumps and regulator circuit for creating regulating voltages. System control logic 262 includes storage 366 (e.g., RAM, registers, latches, etc.), which may be used to store parameters for operating the memory array 202.

Commands and data are transferred between memory controller 120 and memory die 200 via memory controller interface 268 (also referred to as a "communication interface"). Memory controller interface 268 is an electrical interface for communicating with memory controller 120. Examples of memory controller interface 268 include a Toggle Mode Interface and an Open NAND Flash Interface (ONFI). Other I/O interfaces can also be used.

In some embodiments, all the elements of memory die 200, including the system control logic 360, can be formed as part of a single die. In other embodiments, some or all of the system control logic 260 can be formed on a different die.

In one embodiment, memory structure 202 comprises a three-dimensional memory array of non-volatile memory cells in which multiple memory levels are formed above a single substrate, such as a wafer. The memory structure may comprise any type of non-volatile memory that are monolithically formed in one or more physical levels of memory cells having an active area disposed above a silicon (or other type of) substrate. In one example, the non-volatile memory cells comprise vertical NAND strings with charge-trapping layers.

In another embodiment, memory structure 302 comprises a two-dimensional memory array of non-volatile memory cells. In one example, the non-volatile memory cells are NAND flash memory cells utilizing floating gates. Other types of memory cells (e.g., NOR-type flash memory) can also be used.

The exact type of memory array architecture or memory cell included in memory structure 202 is not limited to the examples above. Many different types of memory array architectures or memory technologies can be used to form memory structure 202. No particular non-volatile memory technology is required for purposes of the new claimed embodiments proposed herein. Other examples of suitable technologies for memory cells of the memory structure 202 include ReRAM memories (resistive random access memories), magnetoresistive memory (e.g., MRAM, Spin Transfer Torque MRAM, Spin Orbit Torque MRAM), FeRAM, phase change memory (e.g., PCM), and the like. Examples of suitable technologies for memory cell architectures of the memory structure 202 include two dimensional arrays, three dimensional arrays, cross-point arrays, stacked two dimensional arrays, vertical bit line arrays, and the like.

One example of a ReRAM cross-point memory includes reversible resistance-switching elements arranged in cross-point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Another example is magnetoresistive random access memory (MRAM) that stores data by magnetic storage elements. The elements are formed from two ferromagnetic layers, each of which can hold a magnetization, separated by a thin insulating layer. One of the two layers is a permanent magnet set to a particular polarity; the other layer's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created. MRAM based memory embodiments will be discussed in more detail below.

Phase change memory (PCM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. In other PCM embodiments, the memory cells are programmed by current pulses. Note that the use of "pulse" in this document does not require a square pulse but includes a (continuous or non-continuous) vibration or burst of sound, current, voltage light, or other wave. These memory elements within the individual selectable memory cells, or bits, may include a further series element that is a selector, such as an ovonic threshold switch or metal insulator substrate.

A person of ordinary skill in the art will recognize that the technology described herein is not limited to a single specific memory structure, memory construction or material composition, but covers many relevant memory structures within the spirit and scope of the technology as described herein and as understood by one of ordinary skill in the art.

The elements of FIG. 2A can be grouped into two parts: (1) memory structure 202 and (2) peripheral circuitry, which includes all of the other components depicted in FIG. 2A. An important characteristic of a memory circuit is its capacity, which can be increased by increasing the area of the memory die of storage system 100 that is given over to the memory structure 202; however, this reduces the area of the memory die available for the peripheral circuitry. This can place quite severe restrictions on these elements of the peripheral circuitry. For example, the need to fit sense amplifier circuits within the available area can be a significant restriction on sense amplifier design architectures. With respect to the system control logic 260, reduced availability of area can limit the available functionalities that can be implemented on-chip. Consequently, a basic trade-off in the design of a memory die for the storage system 100 is the amount of area to devote to the memory structure 202 and the amount of area to devote to the peripheral circuitry.

Another area in which the memory structure 202 and the peripheral circuitry are often at odds is in the processing involved in forming these regions, since these regions often involve differing processing technologies and the trade-off in having differing technologies on a single die. For example, when the memory structure 202 is NAND flash, this is an NMOS structure, while the peripheral circuitry is often CMOS based. For example, elements such sense amplifier circuits, charge pumps, logic elements in a state machine, and other peripheral circuitry in system control logic 260 often employ PMOS devices. Processing operations for manufacturing a CMOS die will differ in many aspects from the processing operations optimized for an NMOS flash NAND memory or other memory cell technologies.

To improve upon these limitations, embodiments described below can separate the elements of FIG. 2A onto separately formed dies that are then bonded together. More specifically, the memory structure 302 can be formed on one die (referred to as the memory die) and some or all of the peripheral circuitry elements, including one or more control circuits, can be formed on a separate die (referred to as the control die). For example, a memory die can be formed of just the memory elements, such as the array of memory cells of flash NAND memory, MRAM memory, PCM memory, ReRAM memory, or other memory type. Some or all of the peripheral circuitry, even including elements such as decoders and sense amplifiers, can then be moved on to a separate control die. This allows each of the memory die to be optimized individually according to its technology. For example, a NAND memory die can be optimized for an NMOS based memory array structure, without worrying about the CMOS elements that have now been moved onto a control die that can be optimized for CMOS processing. This allows more space for the peripheral elements, which can now incorporate additional capabilities that could not be readily incorporated were they restricted to the margins of the same die holding the memory cell array. The two die can then be bonded together in a bonded multi-die memory circuit, with the array on the one die connected to the periphery elements on the other die. Although the following will focus on a bonded memory circuit of one memory die and one control die, other embodiments can use more die, such as two memory die and one control die, for example.

Figure 2B:
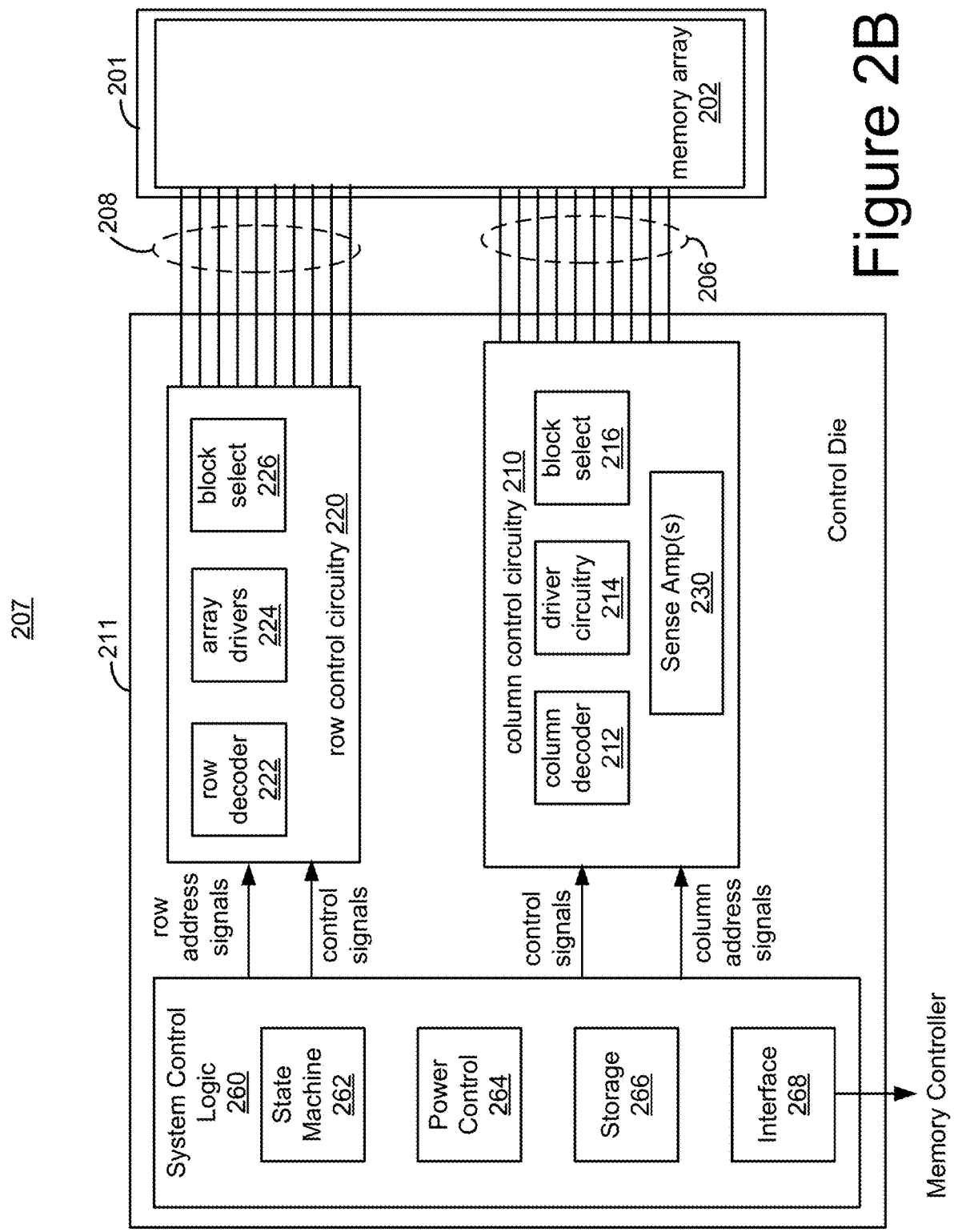
FIG. 2B is a block diagram of one embodiment of an integrated memory assembly.

FIG. 2B shows an alternative arrangement to that of FIG. 2A which may be implemented using wafer-to-wafer bonding to provide a bonded die pair. FIG. 2B depicts a functional block diagram of one embodiment of an integrated memory assembly 207. One or more integrated memory assemblies 207 may be used to implement the non-volatile memory 130 of storage system 100. The integrated memory assembly 307 includes two types of semiconductor die (or more succinctly, "die"). Memory die 201 includes memory structure 202. Memory structure 202 includes non-volatile memory cells. Control die 211 includes control circuitry 260, 210, and 220 (as described above). In some embodiments, control die 211 is configured to connect to the memory structure 202 in the memory die 201. In some embodiments, the memory die 201 and the control die 211 are bonded together.

FIG. 2B shows an example of the peripheral circuitry, including control circuits, formed in a peripheral circuit or control die 311 coupled to memory structure 202 formed in memory die 201. Common components are labelled similarly to FIG. 2A. System control logic 260, row control circuitry 220, and column control circuitry 210 are located in control die 211. In some embodiments, all or a portion of the column control circuitry 210 and all or a portion of the row control circuitry 220 are located on the memory die 201.

In some embodiments, some of the circuitry in the system control logic 260 is located on the on the memory die 201.

System control logic 260, row control circuitry 220, and column control circuitry 210 may be formed by a common process (e.g., CMOS process), so that adding elements and functionalities, such as ECC, more typically found on a memory controller 120 may require few or no additional process steps (i.e., the same process steps used to fabricate controller 120 may also be used to fabricate system control logic 260, row control circuitry 220, and column control circuitry 210). Thus, while moving such circuits from a die such as memory 2 die 201 may reduce the number of steps needed to fabricate such a die, adding such circuits to a die such as control die 311 may not require many additional process steps. The control die 211 could also be referred to as a CMOS die, due to the use of CMOS technology to implement some or all of control circuitry 260, 210, 220.

FIG. 2B shows column control circuitry 210 including sense amplifier(s) 230 on the control die 211 coupled to memory structure 202 on the memory die 201 through electrical paths 206. For example, electrical paths 206 may provide electrical connection between column decoder 212, driver circuitry 214, and block select 216 and bit lines of memory structure 202. Electrical paths may extend from column control circuitry 210 in control die 211 through pads on control die 211 that are bonded to corresponding pads of the memory die 201, which are connected to bit lines of memory structure 202. Each bit line of memory structure 202 may have a corresponding electrical path in electrical paths 306, including a pair of bond pads, which connects to column control circuitry 210. Similarly, row control circuitry 220, including row decoder 222, array drivers 224, and block select 226 are coupled to memory structure 202 through electrical paths 208. Each of electrical path 208 may correspond to a word line, dummy word line, or select gate line. Additional electrical paths may also be provided between control die 211 and memory die 201.

For purposes of this document, the phrases "a control circuit" or "one or more control circuits" can include any one of or any combination of memory controller 120, state machine 262, all or a portion of system control logic 260, all or a portion of row control circuitry 220, all or a portion of column control circuitry 210, a microcontroller, a microprocessor, and/or other similar functioned circuits. The control circuit can include hardware only or a combination of hardware and software (including firmware). For example, a controller programmed by firmware to perform the functions described herein is one example of a control circuit. A control circuit can include a processor, FGA, ASIC, integrated circuit, or other type of circuit.

Figure 2C:
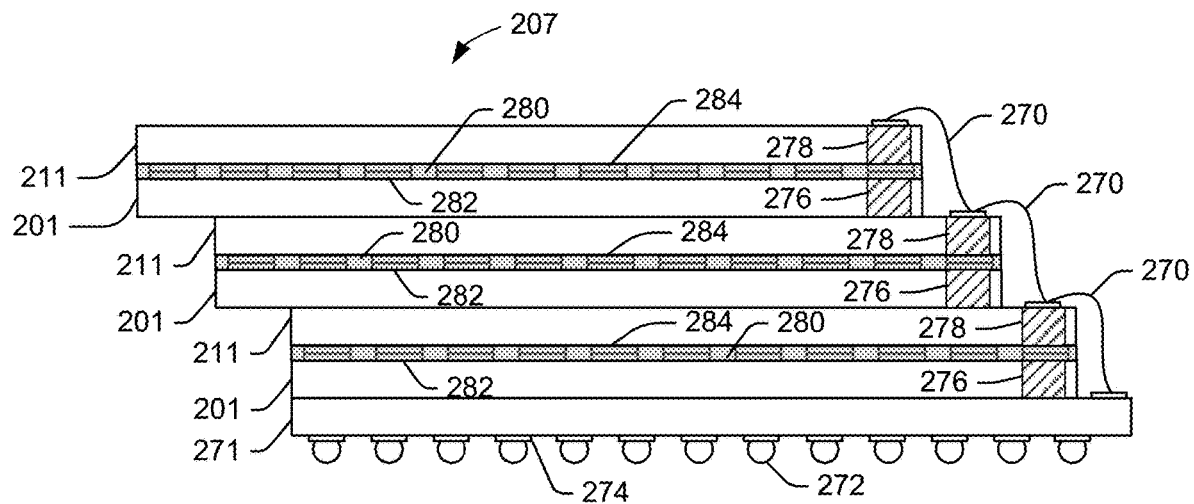
FIGS. 2C and 2D depict different embodiments of integrated memory assemblies.

In some embodiments, there is more than one control die 211 and more than one memory die 201 in an integrated memory assembly 207. In some embodiments, the integrated memory assembly 207 includes a stack of multiple control die 211 and multiple memory die 201. FIG. 2C depicts a side view of an embodiment of an integrated memory assembly 207 stacked on a substrate 271 (e.g., a stack comprising control dies 211 and memory dies 201). The integrated memory assembly 207 has three control dies 211 and three memory dies 201. In some embodiments, there are more than three memory dies 201 and more than three control die 211.

Each control die 211 is affixed (e.g., bonded) to at least one of the memory dies 201. Some of the bond pads 282/284 are depicted. There may be many more bond pads. A space between two dies 201, 211 that are bonded together is filled with a solid layer 280, which may be formed from epoxy or other resin or polymer. This solid layer 280 protects the electrical connections between the dies 201, 211, and further secures the dies together. Various materials may be used as solid layer 280, but in embodiments, it may be Hysol epoxy resin from Henkel Corp., having offices in California, USA.

The integrated memory assembly 207 may for example be stacked with a stepped offset, leaving the bond pads at each level uncovered and accessible from above. Wire bonds 270 connected to the bond pads connect the control die 211 to the substrate 271. A number of such wire bonds may be formed across the width of each control die 211 (i.e., into the page of FIG. 2C).

A memory die through silicon via (TSV) 276 may be used to route signals through a memory die 201. A control die through silicon via (TSV) 278 may be used to route signals through a control die 211. The TSVs 276, 278 may be formed before, during or after formation of the integrated circuits in the semiconductor dies 201, 211. The TSVs may be formed by etching holes through the wafers. The holes may then be lined with a barrier against metal diffusion. The barrier layer may in turn be lined with a seed layer, and the seed layer may be plated with an electrical conductor such as copper, although other suitable materials such as aluminum, tin, nickel, gold, doped polysilicon, and alloys or combinations thereof may be used.

Solder balls 272 may optionally be affixed to contact pads 274 on a lower surface of substrate 271. The solder balls 272 may be used to couple the integrated memory assembly 207 electrically and mechanically to a host device such as a printed circuit board. Solder balls 272 may be omitted where the integrated memory assembly 207 is to be used as an LGA package. The solder balls 272 may form a part of the interface between integrated memory assembly 207 and memory controller 120.

Figure 2D:
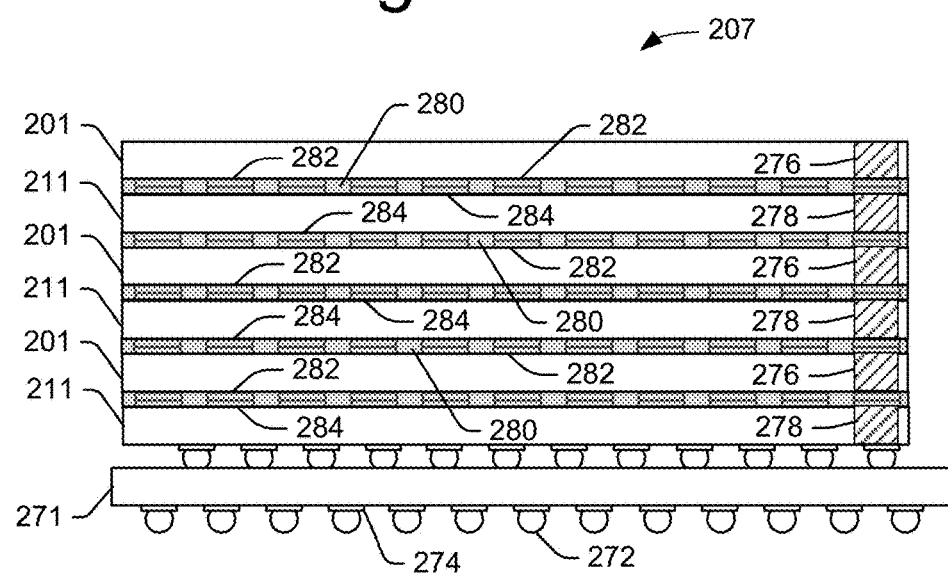

FIG. 2D depicts a side view of another embodiment of an integrated memory assembly 207 stacked on a substrate 271. The integrated memory assembly 206 of FIG. 2D has three control die 211 and three memory die 201. In some embodiments, there are many more than three memory dies 201 and many more than three control dies 211. In this example, each control die 211 is bonded to at least one memory die 201. Optionally, a control die 211 may be bonded to two or more memory die 201.

Some of the bond pads 282, 284 are depicted. There may be many more bond pads. A space between two dies 201, 211 that are bonded together is filled with a solid layer 280, which may be formed from epoxy or other resin or polymer. In contrast to the example in FIG. 2C, the integrated memory assembly 207 in FIG. 2D does not have a stepped offset. A memory die through silicon via (TSV) 276 may be used to route signals through a memory die 201. A control die through silicon via (TSV) 278 may be used to route signals through a control die 211.

Solder balls 272 may optionally be affixed to contact pads 274 on a lower surface of substrate 271. The solder balls 272 may be used to couple the integrated memory assembly 207 electrically and mechanically to a host device such as a printed circuit board. Solder balls 272 may be omitted where the integrated memory assembly 207 is to be used as an LGA package.

As has been briefly discussed above, the control die 211 and the memory die 201 may be bonded together. Bond pads on each die 201, 211 may be used to bond the two dies together. In some embodiments, the bond pads are bonded directly to each other, without solder or other added material, in a so-called Cu-to-Cu bonding process. In a Cu-to-Cu bonding process, the bond pads are controlled to be highly planar and formed in a highly controlled environment largely devoid of ambient particulates that might otherwise settle on a bond pad and prevent a close bond. Under such properly controlled conditions, the bond pads are aligned and pressed against each other to form a mutual bond based on surface tension. Such bonds may be formed at room temperature, though heat may also be applied. In embodiments using Cu-to-Cu bonding, the bond pads may be about 5 µm square and spaced from each other with a pitch of 5 µm to 5 µm. While this process is referred to herein as Cu-to-Cu bonding, this term may also apply even where the bond pads are formed of materials other than Cu.

When the area of bond pads is small, it may be difficult to bond the semiconductor dies together. The size of, and pitch between, bond pads may be further reduced by providing a film layer on the surfaces of the semiconductor dies including the bond pads. The film layer is provided around the bond pads. When the dies are brought together, the bond pads may bond to each other, and the film layers on the respective dies may bond to each other. Such a bonding technique may be referred to as hybrid bonding. In embodiments using hybrid bonding, the bond pads may be about 5 µm square and spaced from each other with a pitch of 1 µm to 5 µm. Bonding techniques may be used providing bond pads with even smaller sizes and pitches.

Some embodiments may include a film on surface of the dies 201, 211. Where no such film is initially provided, a space between the dies may be under filled with an epoxy or other resin or polymer. The under-fill material may be applied as a liquid which then hardens into a solid layer. This under-fill step protects the electrical connections between the dies 201, 211, and further secures the dies together. Various materials may be used as under-fill material, but in embodiments, it may be Hysol epoxy resin from Henkel Corp., having offices in California, USA.

Figure 3:
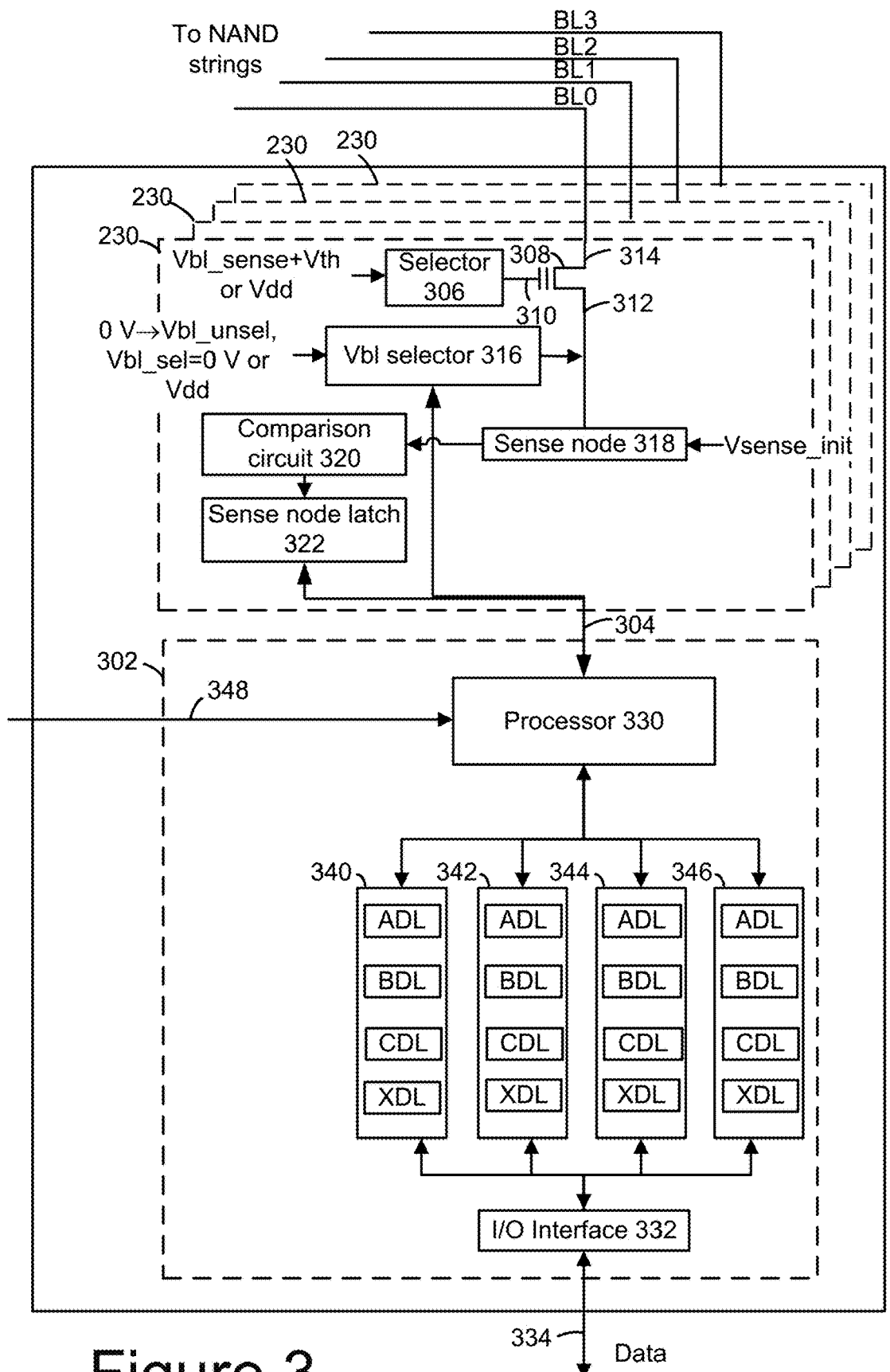
FIG. 3 depicts circuitry used to sense data from non-volatile memory.

FIG. 3 is a block diagram depicting one embodiment of a portion of column control circuitry 210 that is partitioned into a plurality of sense amplifiers 230, and a common portion, referred to as a managing circuit 302. In one embodiment, each sense amplifier 230 is connected to a respective bit line which in turn is connected to one or more NAND strings. In one example implementation, each bit line is connected to six NAND strings, with one NAND string per sub-block. Managing circuit 302 is connected to a set of multiple (e.g., four, eight, etc.) sense amplifiers 230. Each of the sense amplifiers 230 in a group communicates with the associated managing circuit via data bus 304.

Each sense amplifier 230 operates to provide voltages to bit lines (see BL0, BL1. BL2. BL3) during program, verify, erase and read operations. Sense amplifiers are also used to sense the condition (e.g., data state) to a memory cells in a NAND string connected to the bit line that connects to the respective sense amplifier.

Each sense amplifier 230 includes a selector 306 or switch connected to a transistor 308 (e.g., an nMOS). Based on voltages at the control gate 310 and drain 312 of the transistor 308, the transistor can operate as a pass gate or as a bit line clamp. When the voltage at the control gate is sufficiently higher than the voltage on the drain, the transistor operates as a pass gate to pass the voltage at the drain to the bit line (BL) at the source 314 of the transistor. For example, a program-inhibit voltage such as 1-2 V may be passed when pre-charging and inhibiting an unselected NAND string. Or, a program-enable voltage such as 0 V may be passed to allow programming in a selected NAND string.

The selector 306 may pass a power supply voltage Vdd, (e.g., 3-4 V) to the control gate of the transistor 308 to cause it to operate as a pass gate.

When the voltage at the control gate is lower than the voltage on the drain, the transistor 308 operates as a source-follower to set or clamp the bit line voltage at Vcg–Vth, where Vcg is the voltage on the control gate 310 and Vth, e.g., 0.7 V, is the threshold voltage of the transistor 308. This assumes the source line is at 0 V. If Vcelsrc is non-zero, the bit line voltage is clamped at Vcg–Vcelsrc–Vth. The transistor is therefore sometimes referred to as a bit line clamp (BLC) transistor, and the voltage Vcg on the control gate 310 is referred to as a bit line clamp voltage, Vblc. This mode can be used during sensing operations such as read and verify operations. The bit line voltage is thus set by the transistor 308 based on the voltage output by the selector 306. For example, the selector 306 may pass Vsense+Vth, e.g., 1.5 V, to the control gate of the transistor 308 to provide Vsense, e.g., 0.8 V, on the bit line. A Vbl selector 316 may pass a relatively high voltage such as Vdd to the drain 312, which is higher than the control gate voltage on the transistor 308, to provide the source-follower mode during sensing operations. Vbl refers to the bit line voltage.

The Vbl selector 316 can pass one of a number of voltage signals. For example, the Vbl selector can pass a program-inhibit voltage signal which increases from an initial voltage, e.g., 0 V, to a program inhibit voltage, e.g., Vbl_inh for respective bit lines of unselected NAND string during a program loop. The Vbl selector 316 can pass a program-enable voltage signal such as 0 V for respective bit lines of selected NAND strings during a program loop.

In one approach, the selector 306 of each sense circuit can be controlled separately from the selectors of other sense circuits. The Vbl selector 316 of each sense circuit can also be controlled separately from the Vbl selectors of other sense circuits.

During sensing, a sense node 318 is charged up to an initial voltage, Vsense_init, such as 3 V. The sense node is then passed to the bit line via the transistor 308, and an amount of decay of the sense node is used to determine whether a memory cell is in a conductive or non-conductive state. The amount of decay of the sense node also indicates whether a current Icell in the memory cell exceeds a reference current, Iref. A larger decay corresponds to a larger current. If Icell<=Iref, the memory cell is in a non-conductive state and if Icell>Iref, the memory cell is in a conductive state.

In particular, the comparison circuit 320 determines the amount of decay by comparing the sense node voltage to a trip voltage at a sense time. If the sense node voltage decays below the trip voltage, Vtrip, the memory cell is in a conductive state and its Vth is at or below the verify voltage. If the sense node voltage does not decay below Vtrip, the memory cell is in a non-conductive state and its Vth is above the verify voltage. A sense node latch 322 is set to 0 or 1, for example, by the comparison circuit 320 based on whether the memory cell is in a conductive or non-conductive state, respectively. For example, in a program-verify test, a 0 can denote fail and a 1 can denote pass. The bit in the sense node latch can be read out in a state bit scan operation of a scan operation or flipped from 0 to 1 in a fill operation. The bit in the sense node latch 322 can also be used in a lockout scan to decide whether to set a bit line voltage to an inhibit or program level in a next program loop. L Managing circuit 302 comprises a processor 330, four example sets of data latches 340, 342, 344 and 346, and an I/O interface 332 coupled between the sets of data latches and the data bus 334. FIG. 3 shows four example sets of data latches 340, 342, 344 and 346; however, in other embodiments more or less than four can be implemented. In one embodiment, there is one set of latches for each sense amplifier 230. One set of three data latches, e.g., comprising individual latches ADL, BDL, CDL and XDL, can be provided for each sense circuit. In some cases, a different number of data latches may be used. In a three bit per memory cell embodiment, ADL stores a bit for a lower page of data, BDL stores a bit for a middle page of data, CDL stores a bit for an upper page of data and XDL serves as an interface latch for storing/latching data from the memory controller.

Processor 330 performs computations, such as to determine the data stored in the sensed memory cell and store the determined data in the set of data latches. Each set of data latches 340-346 is used to store data bits determined by processor 330 during a read operation, and to store data bits imported from the data bus 334 during a program operation which represent write data meant to be programmed into the memory. I/O interface 332 provides an interface between data latches 340-346 and the data bus 334.

During reading, the operation of the system is under the control of state machine 262 that controls the supply of different control gate voltages to the addressed memory cell. As it steps through the various predefined control gate voltages corresponding to the various memory states supported by the memory, the sense circuit may trip at one of these voltages and a corresponding output will be provided from the sense amplifier to processor 330 via the data bus 304. At that point, processor 330 determines the resultant memory state by consideration of the tripping event(s) of the sense circuit and the information about the applied control gate voltage from the state machine via input lines 348. It then computes a binary encoding for the memory state and stores the resultant data bits into data latches 340-346.

Some implementations can include multiple processors 330. In one embodiment, each processor 330 will include an output line (not depicted) such that each of the output lines is connected in a wired-OR connection. A wired OR connection or line can be provided by connecting multiple wires together at a node, where each wire carries a high or low input signal from a respective processor, and an output of the node is high if any of the input signals is high. In some embodiments, the output lines are inverted prior to being connected to the wired-OR line. This configuration enables a quick determination during a program verify test of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with eight sense circuits, the state machine needs to read the wired-OR line eight times, or logic is added to processor 330 to accumulate the results of the associated bit lines such that the state machine need only read the wired-OR line one time. Similarly, by choosing the logic levels correctly, the global state machine can detect when the first bit changes its state and change the algorithms accordingly.

During program or verify operations for memory cells, the data to be programmed (write data) is stored in the set of data latches 340-346 from the data bus 334. During reprogramming, a respective set of data latches of a memory cell can store data indicating when to enable the memory cell for reprogramming based on the program pulse magnitude.

The program operation, under the control of the state machine 262, applies a series of programming voltage pulses to the control gates of the addressed memory cells. Each voltage pulse may be stepped up in magnitude from a previous program pulse by a step size in a processed referred to as incremental step pulse programming. Each program voltage is followed by a verify operation to determine if the memory cells has been programmed to the desired memory state. In some cases, processor 330 monitors the read back memory state relative to the desired memory state. When the two are in agreement, processor 330 sets the bit line in a program inhibit mode such as by updating its latches. This inhibits the memory cell coupled to the bit line from further programming even if additional program pulses are applied to its control gate.

Figure 4:
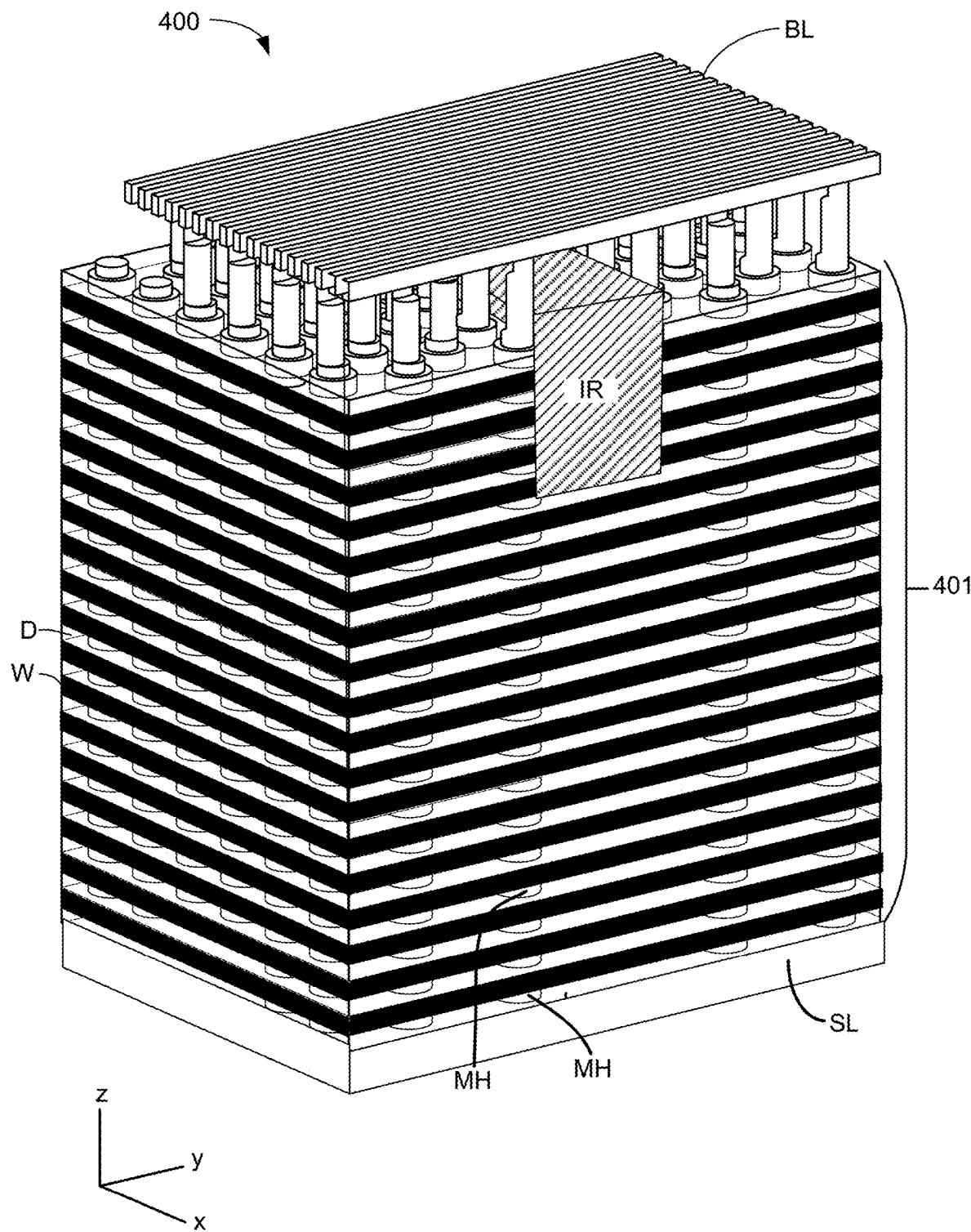
FIG. 4 is a perspective view of a portion of one embodiment of a monolithic three dimensional memory structure.

FIG. 4 is a perspective view of a portion of one example embodiment of a monolithic three dimensional memory array/structure that can comprise memory structure 202, which includes a plurality non-volatile memory cells arranged as vertical NAND strings. For example, FIG. 4 shows a portion 400 of one block of memory. The structure depicted includes a set of bit lines BL positioned above a stack 401 of alternating dielectric layers and conductive layers. For example purposes, one of the dielectric layers is marked as D and one of the conductive layers (also called word line layers) is marked as W. The number of alternating dielectric layers and conductive layers can vary based on specific implementation requirements. As will be explained below, in one embodiment the alternating dielectric layers and conductive layers are divided into six (or a different number of) regions (e.g., sub-blocks) by isolation regions IR. FIG. 4 shows one isolation region IR separating two sub-blocks. Below the alternating dielectric layers and word line layers is a source line layer SL. Memory holes are formed in the stack of alternating dielectric layers and conductive layers. For example, one of the memory holes is marked as MH. Note that in FIG. 4, the dielectric layers are depicted as see-through so that the reader can see the memory holes positioned in the stack of alternating dielectric layers and conductive layers. In one embodiment, NAND strings are formed by filling the memory hole with materials including a charge-trapping material to create a vertical column of memory cells. Each memory cell can store one or more bits of data. More details of the three dimensional monolithic memory array that comprises memory structure 202 is provided below.

Figure 4A:
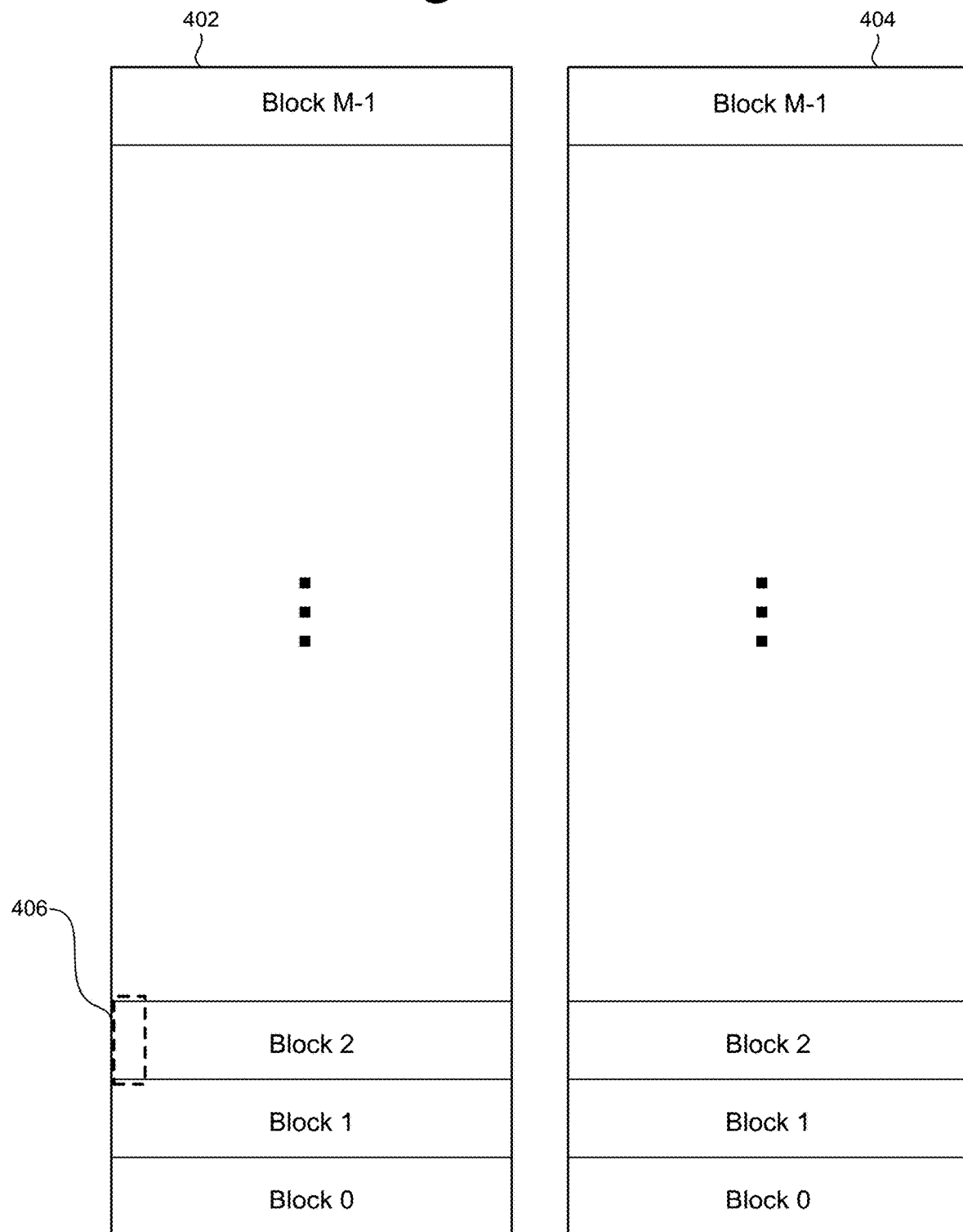
FIG. 4A is a block diagram of one embodiment of a memory structure having two planes.

FIG. 4A is a block diagram explaining one example organization of memory structure 202, which is divided into two planes 402 and 404. Each plane is then divided into M blocks. In one example, each plane has about 2000 blocks. However, different numbers of blocks and planes can also be used. In on embodiment, a block of memory cells is a unit of erase. That is, all memory cells of a block are erased together. In other embodiments, blocks can be divided into sub-blocks and the sub-blocks can be the unit of erase. Memory cells can also be grouped into blocks for other reasons, such as to organize the memory structure to enable the signaling and selection circuits. In some embodiments, a block represents a groups of connected memory cells as the memory cells of a block share a common set of word lines. For example, the word lines for a block are all connected to all of the vertical NAND strings for that block. Although FIG. 4A shows two planes 402/404, more or less than two planes can be implemented. In some embodiments, memory structure 202 includes eight planes.

Figure 4B:
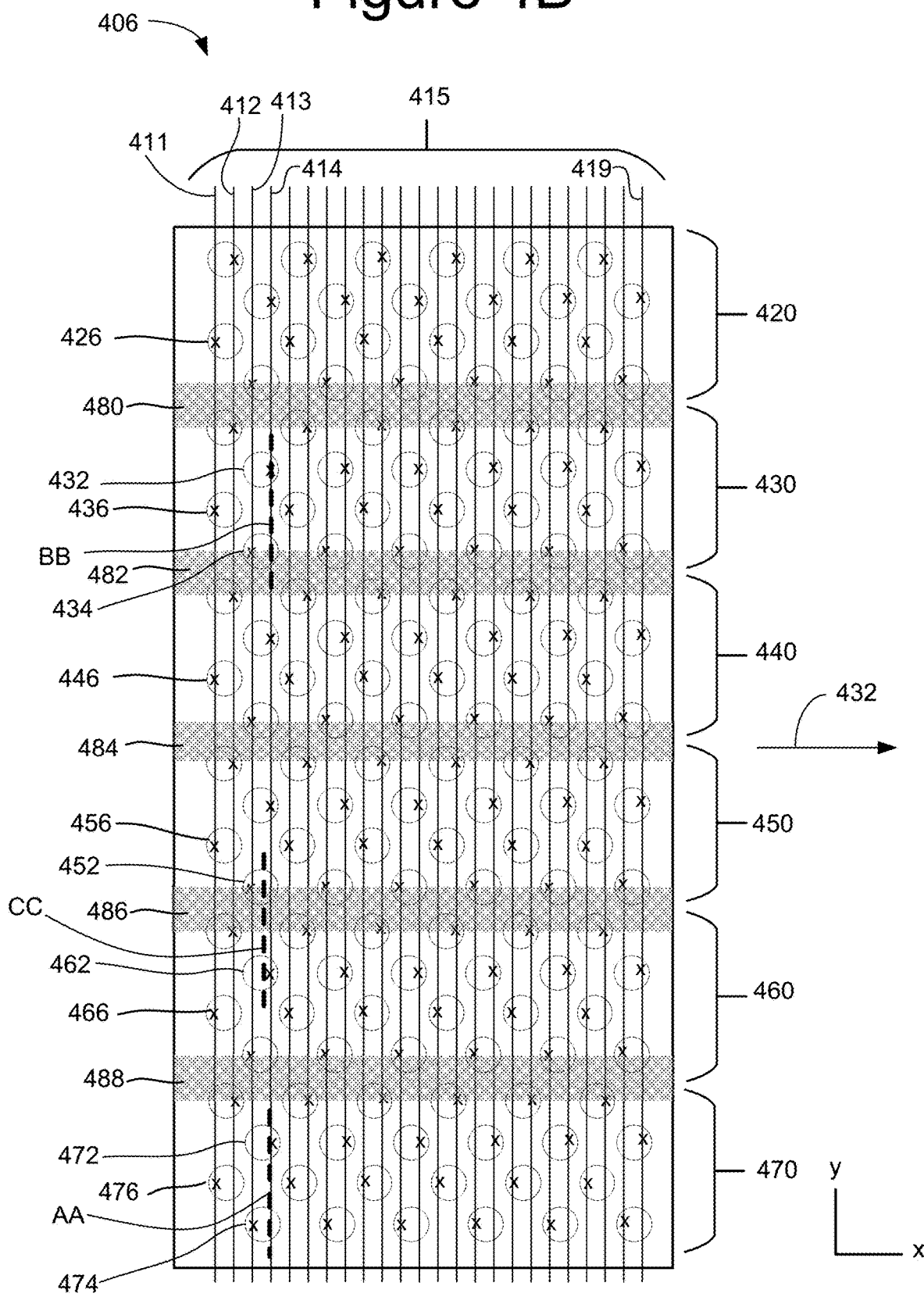
FIG. 4B depicts a top view of a portion of one embodiment of a block of memory cells.

FIGS. 4B-4J depict an example three dimensional ("3D") NAND structure that corresponds to the structure of FIG. 4 and can be used to implement memory structure 202 of FIGS. 2A and 2B. FIG. 4B is a block diagram depicting a top view of a portion 406 of Block 2 of plane 402. As can be seen from FIG. 4B, the block depicted in FIG. 4B extends in the direction of 432. In one embodiment, the memory array has many layers; however, FIG. 4B only shows the top layer.

FIG. 4B depicts a plurality of circles that represent the vertical columns, which correspond to the memory holes. Each of the vertical columns include multiple select transistors (also referred to as a select gate or selection gate) and multiple memory cells. In one embodiment, each vertical column implements a NAND string. For example, FIG. 4B labels a subset of the vertical columns/NAND strings 426, 432, 436, 446. 456, 462, 466, 472, 474 and 476.

FIG. 4B also depicts a set of bit lines 415, including bit lines 411, 412, 413, 414, . . . 419. FIG. 4B shows twenty four bit lines because only a portion of the block is depicted. It is contemplated that more than twenty four bit lines connected to vertical columns of the block. Each of the circles representing vertical columns has an "x" to indicate its connection to one bit line. For example, bit line 411 is connected to vertical columns 426, 436, 446, 456, 466 and 476.

The block depicted in FIG. 4B includes a set of isolation regions 480, 482, 484, 486 and 488, which are formed of SiO$_2$; however, other dielectric materials can also be used. Isolation regions 480, 482, 484, 486 and 488 serve to divide the top layers of the block into six regions; for example, the top layer depicted in FIG. 4B is divided into regions 420, 430, 440, 450, 460 and 470 all of which are referred to as sub-blocks. In one embodiment, the isolation regions only divide the layers used to implement select gates so that NAND strings in different sub-blocks can be independently selected. In one example implementation, a bit line only connects to one vertical column/NAND string in each of regions (sub-blocks) 420, 430, 440, 450, 460 and 470. In that implementation, each block has twenty four rows of active columns and each bit line connects to six rows in each block. In one embodiment, all of the six vertical columns/NAND strings connected to a common bit line are connected to the same word line (or set of word lines); therefore, the system uses the drain side selection lines to choose one (or another subset) of the six to be subjected to a memory operation (program, verify, read, and/or erase).

Although FIG. 4B shows each region 420, 430, 440, 450, 460 and 470 having four rows of vertical columns, six regions and twenty four rows of vertical columns in a block, those exact numbers are an example implementation. Other embodiments may include more or less regions per block, more or less rows of vertical columns per region and more or less rows of vertical columns per block. FIG. 4B also shows the vertical columns being staggered. In other embodiments, different patterns of staggering can be used. In some embodiments, the vertical columns are not staggered.

Figure 4C:
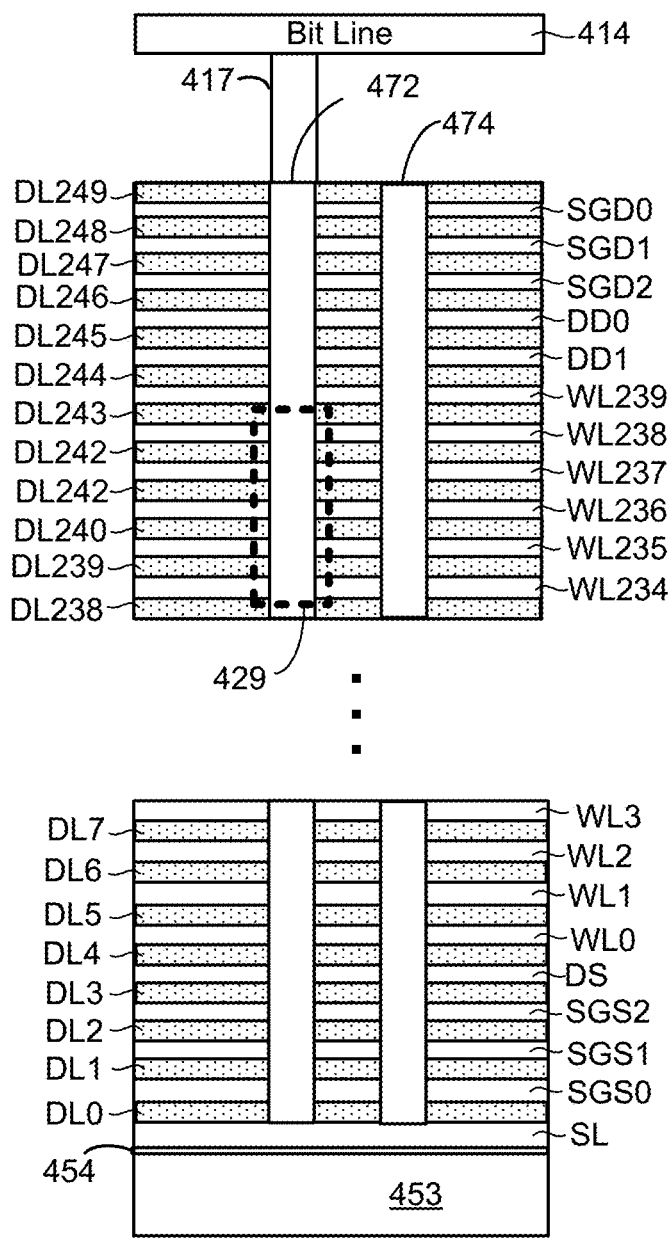
FIG. 4C depicts a cross sectional view of a portion of one embodiment of a block of memory cells.

FIG. 4C depicts a portion of one embodiment of a three dimensional memory structure 202 showing a cross-sectional view along line AA of FIG. 4B. This cross sectional view cuts through vertical columns (NAND strings) 472 and 474 of region 470 (see FIG. 4B). The structure of FIG. 4C includes three drain side select layers SGD0, SGD1 and SGD2; three source side select layers SGS0, SGS1, and SGS2; three dummy word line layers DD0, DD1, and DDS; two hundred and forty word line layers WL0-WL239 for connecting to data memory cells, and two hundred and fifty dielectric layers D10-DL249. Other embodiments can implement more or less than the numbers described above for FIG. 4C. In one embodiment, SGD0, SGD1 and SGD2 are connected together; and SGDS0, SGS1 and SGS2 are connected together.

Vertical columns 472 and 474 are depicted protruding through the drain side select layers, source side select layers, dummy word line layers and word line layers. In one embodiment, each vertical column comprises a vertical NAND string. Below the vertical columns and the layers listed below is substrate 453, an insulating film 454 on the substrate, and source line SL. The NAND string of vertical column 442 has a source end at a bottom of the stack and a drain end at a top of the stack. As in agreement with FIG. 4B, FIG. 4C show vertical column 442 connected to bit line 414 via connector 417.

For ease of reference, drain side select layers; source side select layers, dummy word line layers and data word line layers collectively are referred to as the conductive layers. In one embodiment, the conductive layers are made from a combination of TiN and Tungsten. In other embodiments, other materials can be used to form the conductive layers, such as doped polysilicon, metal such as Tungsten or metal silicide. In some embodiments, different conductive layers can be formed from different materials. Between conductive layers are dielectric layers DL0-DL249. For example, dielectric layers DL240 is above word line layer WL235 and below word line layer WL236. In one embodiment, the dielectric layers are made from $SiO_2$. In other embodiments, other dielectric materials can be used to form the dielectric layers.

The non-volatile memory cells are formed along vertical columns which extend through alternating conductive and dielectric layers in the stack. In one embodiment, the memory cells are arranged in NAND strings. The word line layers WL0-W239 connect to memory cells (also called data memory cells). Dummy word line layers DD0, DD1 and DS connect to dummy memory cells. A dummy memory cell does not store and is not eligible to store host data (data provided from the host, such as data from a user of the host), while a data memory cell is eligible to store host data. In some embodiments, data memory cells and dummy memory cells may have a same structure. Drain side select layers SGD0, SGD1, and SGD2 are used to electrically connect and disconnect NAND strings from bit lines. Source side select layers SGS0, SGS1, and SGS2 are used to electrically connect and disconnect NAND strings from the source line SL.

Figure 4D:
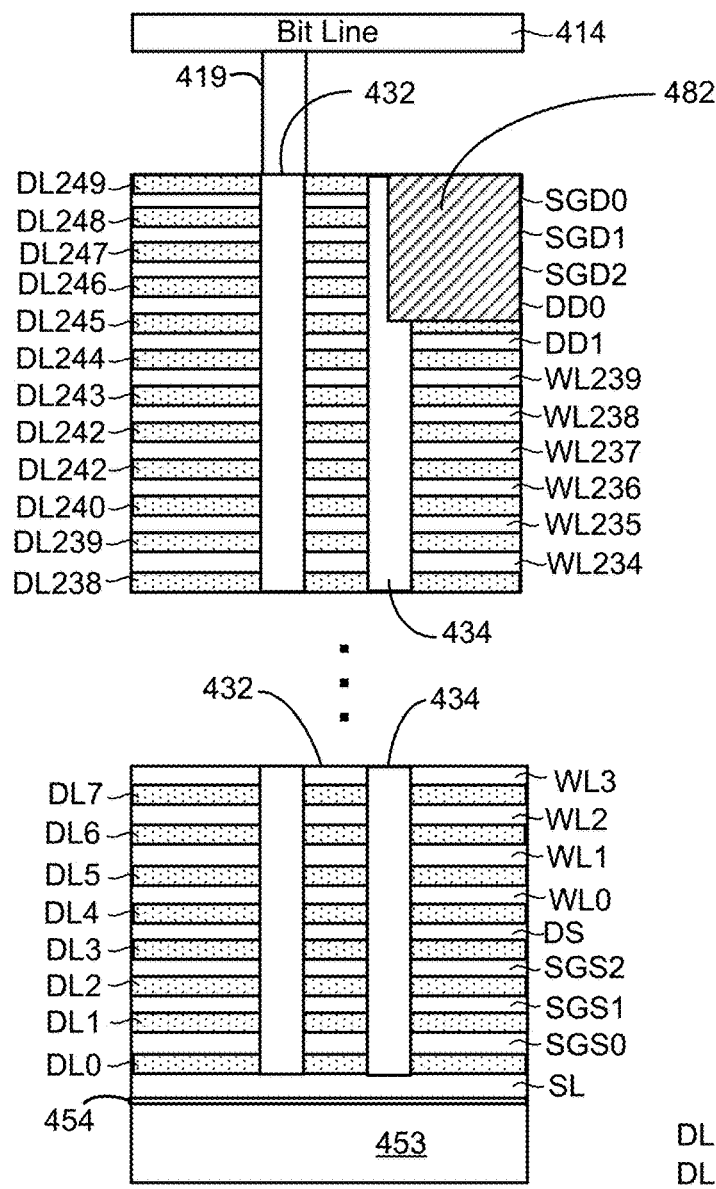
FIG. 4D depicts a cross sectional view of a portion of one embodiment of a block of memory cells.

FIG. 4D depicts a portion of one embodiment of a three dimensional memory structure 202 showing a cross-sectional view along line BB of FIG. 4B. This cross sectional view cuts through vertical columns (NAND strings) 432 and 434 of region 430 (see FIG. 4B). FIG. 4D shows the same alternating conductive and dielectric layers as FIG. 4C. FIG. 4D also shows isolation region 482. Isolation regions 480, 482, 484, 486 and 488) occupy space that would have been used for a portion of the memory holes/vertical columns/NAND stings. For example, isolation region 482 occupies space that would have been used for a portion of vertical column 434. More specifically, a portion (e.g., half the diameter) of vertical column 434 has been removed in layers SDG0, SDG1, SGD2, and DD0 to accommodate isolation region 482. Thus, while most of the vertical column 434 is cylindrical (with a circular cross section), the portion of vertical column 434 in layers SDG0, SDG1, SGD2, and DD0 has a semi-circular cross section. In one embodiment, after the stack of alternating conductive and dielectric layers is formed, the stack is etched to create space for the isolation region and that space is then filled in with $SiO_2$.

Figure 4E:
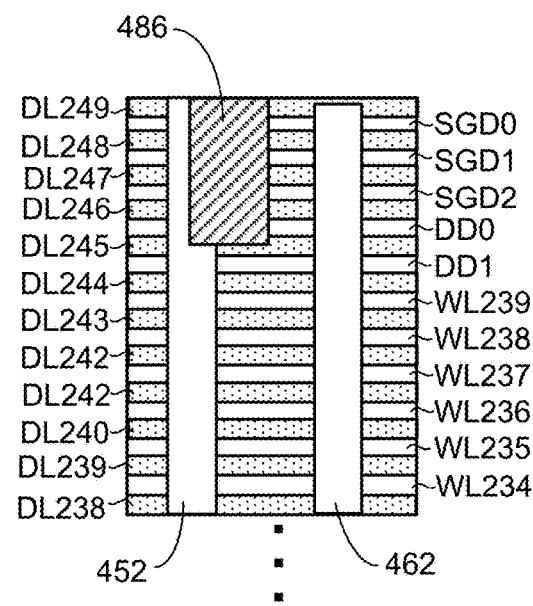
FIG. 4E depicts a cross sectional view of a portion of one embodiment of a block of memory cells.

FIG. 4E depicts a portion of one embodiment of a three dimensional memory structure 202 showing a cross-sectional view along line CC of FIG. 4B. This cross sectional view cuts through vertical columns (NAND strings) 452 and 4624 (see FIG. 4B). FIG. 4E shows the same alternating conductive and dielectric layers as FIG. 4C. FIG. 4E also shows isolation region 486 cutting into vertical columns (NAND string) 452.

Figure 4F:
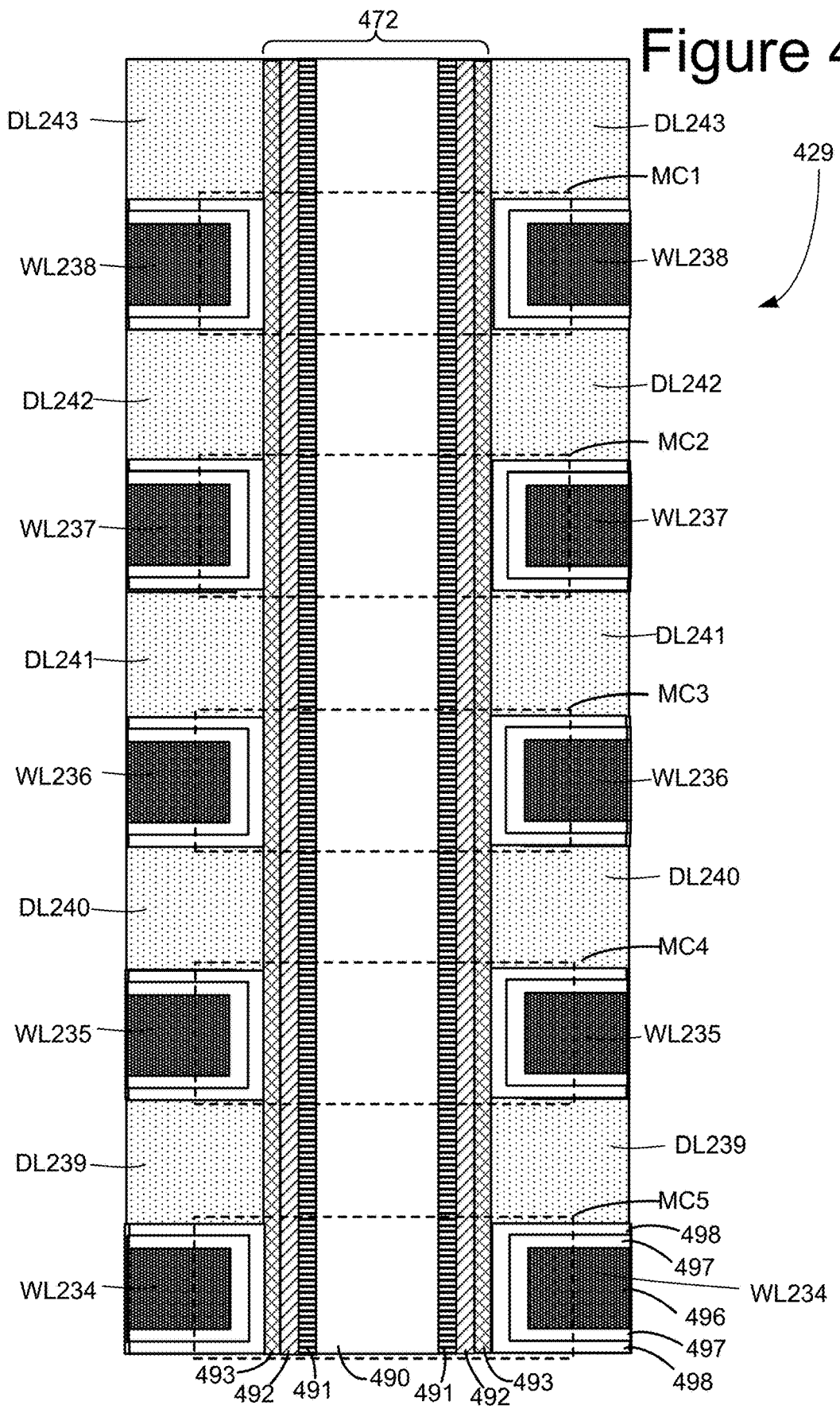
FIG. 4F is a cross sectional view of one embodiment of a vertical column of memory cells.

FIG. 4F depicts a cross sectional view of region 429 of FIG. 4C that includes a portion of vertical column 472. In one embodiment, the vertical columns are round; however, in other embodiments other shapes can be used. In one embodiment, vertical column 472 includes an inner core layer 490 that is made of a dielectric, such as $SiO_2$. Other materials can also be used. Surrounding inner core 490 is polysilicon channel 491. Materials other than polysilicon can also be used. Note that it is the channel 491 that connects to the bit line and the source line. Surrounding channel 491 is a tunneling dielectric 492. In one embodiment, tunneling dielectric 492 has an ONO structure. Surrounding tunneling dielectric 492 is charge trapping layer 493, such as (for example) Silicon Nitride. Other memory materials and structures can also be used. The technology described herein is not limited to any particular material or structure.

FIG. 4D depicts dielectric layers DLL239, DLL240, DLL241, DLL242 and DLL243, as well as word line layers WLL234, WLL235, WLL236, WLL237, and WLL238. Each of the word line layers includes a word line region 496 surrounded by an aluminum oxide layer 497, which is surrounded by a blocking oxide layer 498. In other embodiments, the blocking oxide layer can be a vertical layer parallel and adjacent to charge trapping layer 493. The physical interaction of the word line layers with the vertical column forms the memory cells. Thus, a memory cell, in one embodiment, comprises channel 491, tunneling dielectric 492, charge trapping layer 493, blocking oxide layer 498, aluminum oxide layer 497 and word line region 496. For example, word line layer WLL238 and a portion of vertical column 472 comprise a memory cell MC1. Word line layer WL237 and a portion of vertical column 472 comprise a memory cell MC2. Word line layer WLL236 and a portion of vertical column 472 comprise a memory cell MC3. Word line layer WLL235 and a portion of vertical column 472 comprise a memory cell MC4. Word line layer WLL234 and a portion of vertical column 472 comprise a memory cell MC5. In other architectures, a memory cell may have a different structure; however, the memory cell would still be the storage unit.

When a memory cell is programmed, electrons are stored in a portion of the charge trapping layer 493 which is associated with (e.g. in) the memory cell. These electrons are drawn into the charge trapping layer 493 from the channel 491, through the tunneling dielectric 492, in response to an appropriate voltage on word line region 496. The threshold voltage (Vth) of a memory cell is increased in proportion to the amount of stored charge. In one embodiment, the programming is achieved through Fowler-Nordheim tunneling of the electrons into the charge trapping layer. During an erase operation, the electrons return to the channel or holes are injected into the charge trapping layer to recombine with electrons. In one embodiment, erasing is achieved using hole injection into the charge trapping layer via a physical mechanism such as GIDL.

Figure 4G:
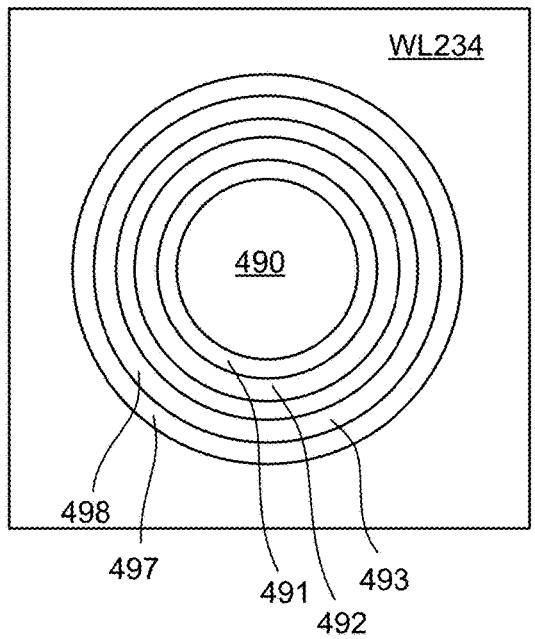
FIG. 4G depicts a cross section of as memory hole that implements a vertical NAND string.

FIG. 4G shows a cross section of vertical column 472 of FIG. 4F, cut through MC5. Thus, FIG. 4G depicts word line layer WL234, inner core 490, channel 491, tunneling dielectric 492, charge trapping layer 493, aluminum oxide layer 497, and blocking oxide layer 498.

Figure 4H:
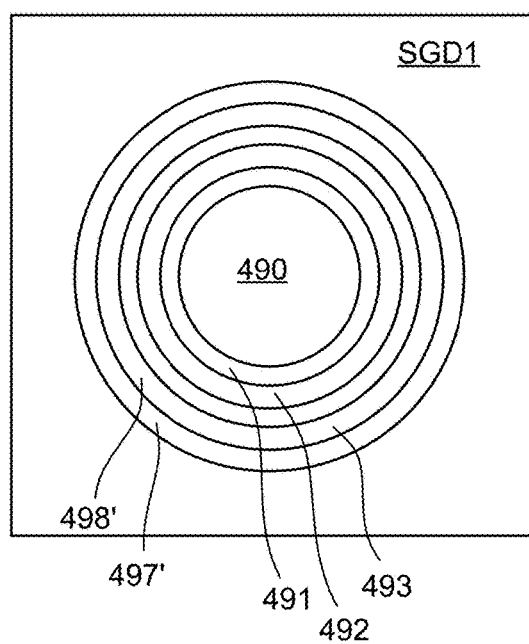
FIG. 4H depicts a cross section of as memory hole that implements a vertical NAND string.

FIG. 4H shows a cross section of vertical column 472 of FIG. 4F, cut through SGD1. Thus, FIG. 4H depicts drain side select line layer SGD1, inner core 490, channel 491, tunneling dielectric 492, charge trapping layer 493, aluminum oxide layer 497, and blocking oxide layer 498.

Figure 4I:
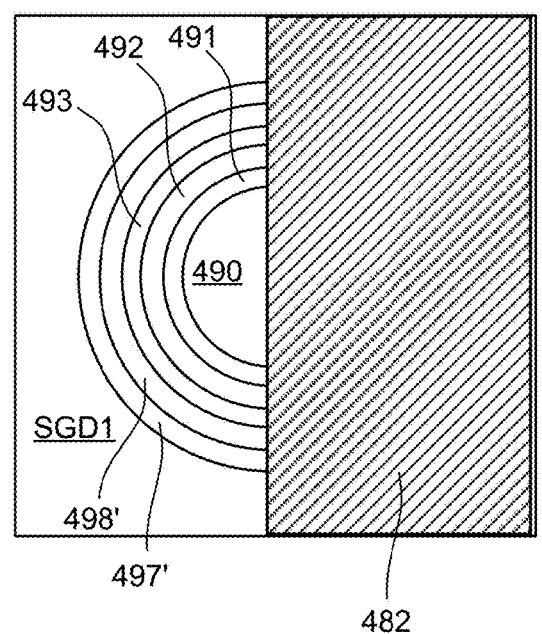
FIG. 4I depicts a cross section of as memory hole that implements a vertical NAND string.

FIG. 4I shows a cross section of vertical column 434 of FIG. 4D, cut through SGD1. Thus, FIG. 4I depicts drain side select line layer SGD1, inner core 490, channel 491, tunneling dielectric 492, charge trapping layer 493, aluminum oxide layer 497, and blocking oxide layer 498. FIG. 4I also shows a portion of isolation region 482. As can be seen in FIG. 4I, the select gate of vertical column 434 is semicircular in shape due to vertical column (NAND string) 434 intersecting isolation region 482.

Figure 4J:
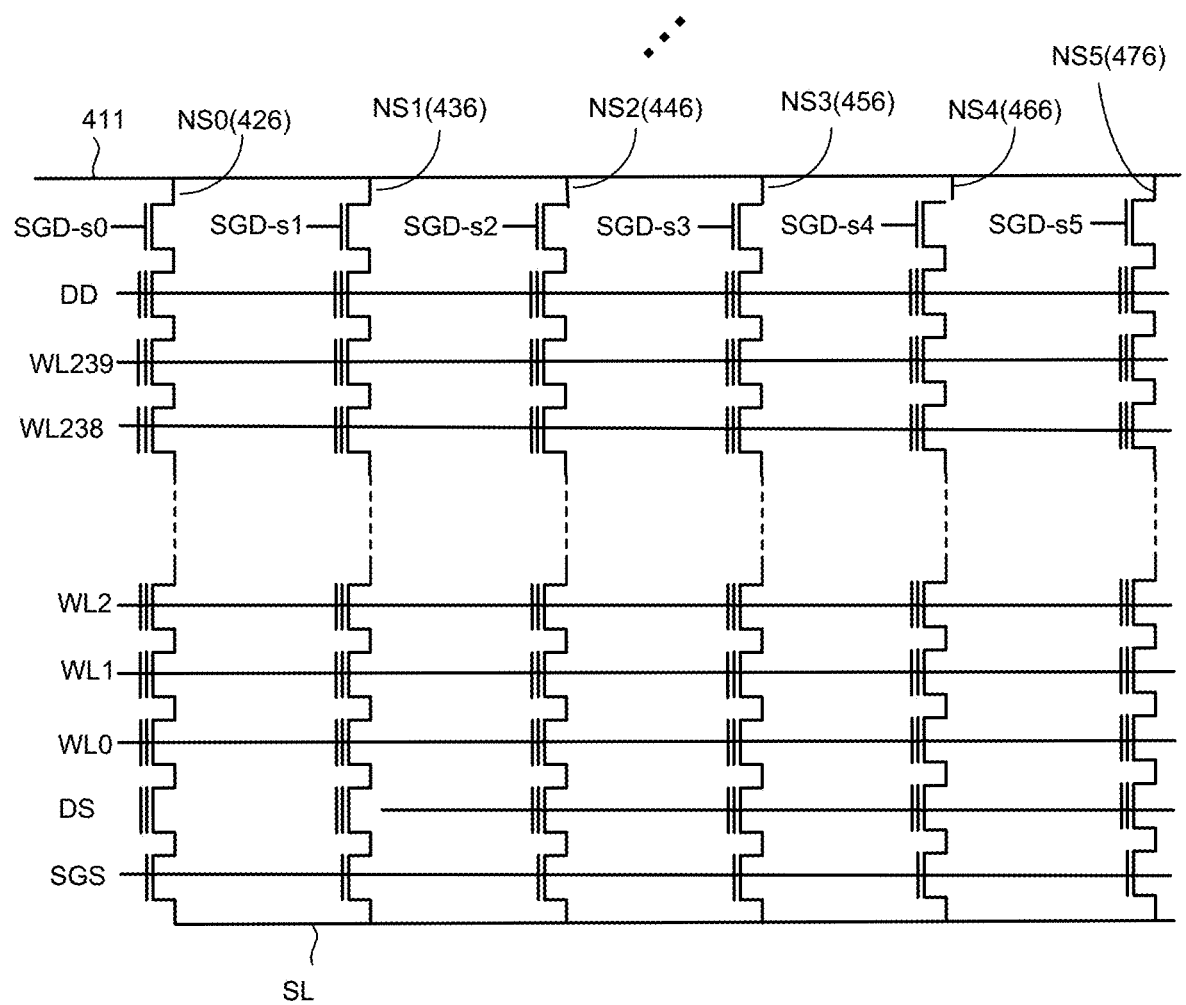
FIG. 4J is a schematic of a plurality of NAND strings in multiple sub-blocks of a same block.

FIG. 4J is a schematic diagram of a portion of the memory array 202 depicted in in FIGS. 4-4I. FIG. 4J shows physical data word lines WL0-WL239 running across the entire block. The structure of FIG. 4J corresponds to a portion 306 in Block 2 of Figure A, including bit line 411. Within the block, in one embodiment, each bit line is connected to six NAND strings. Thus, FIG. 4J shows bit line connected to NAND string NS0 (which corresponds to vertical column 426), NAND string NS1 (which corresponds to vertical column 436), NAND string NS2 (which corresponds to vertical column 446), NAND string NS3 (which corresponds to vertical column 456), NAND string NS4 (which corresponds to vertical column 466), and NAND string NS5 (which corresponds to vertical column 476). As mentioned above, in one embodiment, SGD0, SGD1 and SGD2 are connected together to operate as a single logical select gate for each sub-block separated by isolation regions (480, 482, 484, 486 and 486) to form SGD-s0, SGD-s1, SGD-s2, SGD-s3, SGD-s4, and SGD-s5. SGS0, SG1 and SGS2 are also connected together to operate as a single logical select gate that is represented in FIG. 4E as SGS. Although the select gates SGD-s0, SGD-s1, SGD-s2, SGD-s3, SGD-s4, and SGD-s5 are isolated from each other due to the isolation regions, the data word lines WL0-WL239 of each sub-block are connected together.

The isolation regions (480, 482, 484, 486 and 486) are used to allow for separate control of sub-blocks. A first sub-block corresponds to those vertical NAND strings controlled by SGD-s0. A second sub-block corresponds to those vertical NAND strings controlled by SGD-s1. A third sub-block corresponds to those vertical NAND strings controlled by SGD-s2. A fourth sub-block corresponds to those vertical NAND strings controlled by SGD-s3. A fifth sub-block corresponds to those vertical NAND strings controlled by SGD-s4. A sixth sub-block corresponds to those vertical NAND strings controlled by SGD-s5.

FIG. 4J only shows the NAND strings connected to bit line 411. However, a full schematic of the block would show every bit line and six vertical NAND strings connected to each bit line.

Although the example memories of FIGS. 4-4J are three dimensional memory structure that includes vertical NAND strings with charge-trapping material, other (2D and 3D) memory structures can also be used with the technology described herein.

Figure 5A:
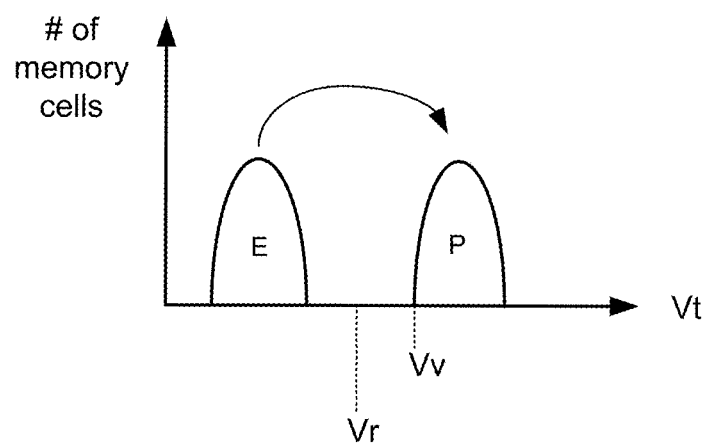
FIG. 5A depicts threshold voltage distributions.

The memory systems discussed above can be erased, programmed and read. At the end of a successful programming process, the threshold voltages of the memory cells should be within one or more distributions of threshold voltages for programmed memory cells or within a distribution of threshold voltages for erased memory cells, as appropriate. FIG. 5A is a graph of threshold voltage versus number of memory cells, and illustrates example threshold voltage distributions for the memory array when each memory cell stores one bit of data per memory cell. Memory cells that store one bit of data per memory cell data are referred to as single level cells ("SLC"). The data stored in SLC memory cells is referred to as SLC data; therefore, SLC data comprises one bit per memory cell. Data stored as one bit per memory cell is SLC data. FIG. 5A shows two threshold voltage distributions: E and P. Threshold voltage distribution E corresponds to an erased data state. Threshold voltage distribution P corresponds to a programmed data state. Memory cells that have threshold voltages in threshold voltage distribution E are, therefore, in the erased data state (e.g., they are erased). Memory cells that have threshold voltages in threshold voltage distribution P are, therefore, in the programmed data state (e.g., they are programmed). In one embodiment, erased memory cells store data "1" and programmed memory cells store data "0." FIG. 5A depicts read reference voltage Vr. By testing (e.g., performing one or more sense operations) whether the threshold voltage of a given memory cell is above or below Vr, the system can determine a memory cells is erased (state E) or programmed (state P). FIG. 5A also depicts verify reference voltage Vv. In some embodiments, when programming memory cells to data state P, the system will test whether those memory cells have a threshold voltage greater than or equal to Vv.

Figure 5B:
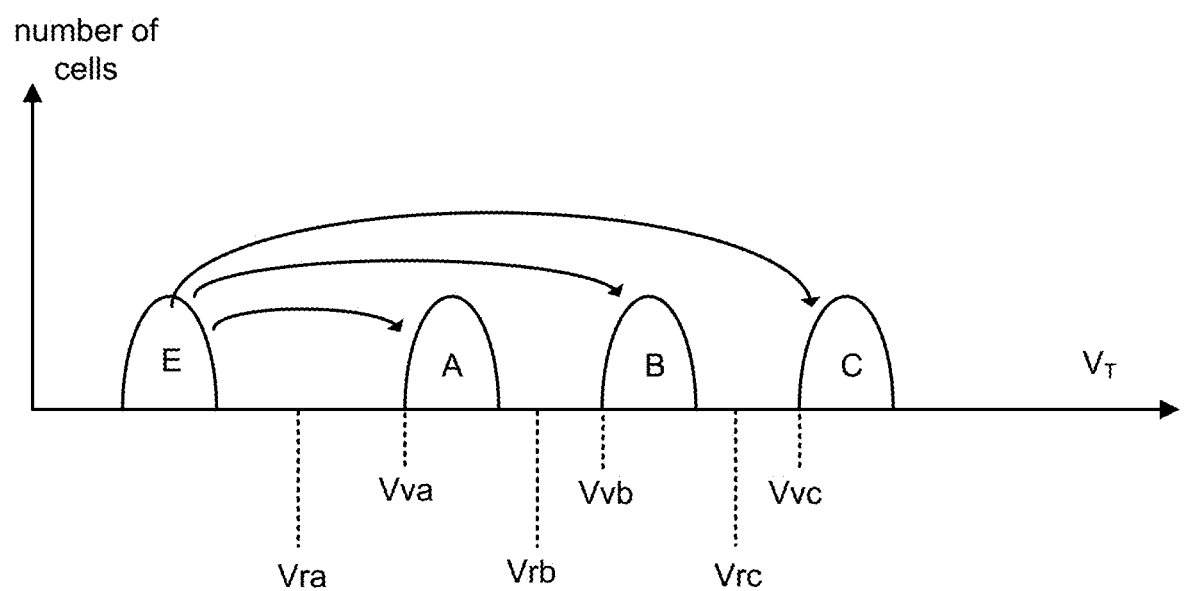
FIG. 5B depicts threshold voltage distributions.

FIGS. 5B-D illustrate example threshold voltage distributions for the memory array when each memory cell stores multiple bit per memory cell data. Memory cells that store multiple bit per memory cell data are referred to as multi-level cells ("MLC"). The data stored in MLC memory cells is referred to as MLC data; therefore, MLC data comprises multiple bits per memory cell. Data stored as multiple bits of data per memory cell is MLC data. In the example embodiment of FIG. 5B, each memory cell stores two bits of data. Other embodiments may use other data capacities per memory cell (e.g., such as three, four, or five bits of data per memory cell).

FIG. 5B shows a first threshold voltage distribution E for erased memory cells. Three threshold voltage distributions A, B and C for programmed memory cells are also depicted. In one embodiment, the threshold voltages in the distribution E are negative and the threshold voltages in distributions A, B and C are positive. Each distinct threshold voltage distribution of FIG. 5B corresponds to predetermined values for the set of data bits. In one embodiment, each bit of data of the two bits of data stored in a memory cell are in different logical pages, referred to as a lower page (LP) and an upper page (UP). In other embodiments, all bits of data stored in a memory cell are in a common logical page. The specific relationship between the data programmed into the memory cell and the threshold voltage levels of the cell depends upon the data encoding scheme adopted for the cells. Table 1 provides an example encoding scheme.

TABLE 1

|    | E | A | B | C |
|----|---|---|---|---|
| LP | 1 | 0 | 0 | 1 |
| UP | 1 | 1 | 0 | 0 |

In one embodiment, known as full sequence programming, memory cells can be programmed from the erased data state E directly to any of the programmed data states A, B or C using the process of FIG. 6 (discussed below). For example, a population of memory cells to be programmed may first be erased so that all memory cells in the population are in erased data state E. Then, a programming process is used to program memory cells directly into data states A, B, and/or C. For example, while some memory cells are being programmed from data state E to data state A, other memory cells are being programmed from data state E to data state B and/or from data state E to data state C. The arrows of FIG. 5B represent the full sequence programming. In some embodiments, data states A-C can overlap, with memory controller 120 (or control die 211) relying on error correction to identify the correct data being stored.

FIG. 5C depicts example threshold voltage distributions for memory cells where each memory cell stores three bits of data per memory cells (which is another example of MLC data). FIG. 5C shows eight threshold voltage distributions, corresponding to eight data states. The first threshold voltage distribution (data state) Er represents memory cells that are erased. The other seven threshold voltage distributions (data states) A-G represent memory cells that are programmed and, therefore, are also called programmed states. Each threshold voltage distribution (data state) corresponds to predetermined values for the set of data bits. The specific relationship between the data programmed into the memory cell and the threshold voltage levels of the cell depends upon the data encoding scheme adopted for the cells. In one embodiment, data values are assigned to the threshold voltage ranges using a Gray code assignment so that if the threshold voltage of a memory erroneously shifts to its neighboring physical state, only one bit will be affected. Table 2 provides an example of an encoding scheme for embodiments in which each bit of data of the three bits of data stored in a memory cell are in different logical pages, referred to as a lower page (LP), middle page (MP) and an upper page (UP).

TABLE 2

|    | Er | A | B | C | D | E | F | G |
|----|----|---|---|---|---|---|---|---|
| UP | 1  | 1 | 1 | 0 | 0 | 0 | 0 | 1 |
| MP | 1  | 1 | 0 | 0 | 1 | 1 | 0 | 0 |
| LP | 1  | 0 | 0 | 0 | 0 | 1 | 1 | 1 |

FIG. 5C shows seven read reference voltages, VrA, VrB, VrC, VrD, VrE, VrF, and VrG for reading data from memory cells. By testing (e.g., performing sense operations) whether the threshold voltage of a given memory cell is above or below the seven read reference voltages, the system can determine what data state (i.e., A, B, C, D, . . . ) a memory cell is in.

FIG. 5C also shows seven verify reference voltages, VvA, VvB, VvC, VvD, VvE, VvF, and VvG. In some embodiments, when programming memory cells to data state A, the system will test whether those memory cells have a threshold voltage greater than or equal to VvA. When programming memory cells to data state B, the system will test whether the memory cells have threshold voltages greater than or equal to VvB. When programming memory cells to data state C, the system will determine whether memory cells have their threshold voltage greater than or equal to VvC. When programming memory cells to data state D, the system will test whether those memory cells have a threshold voltage greater than or equal to VvD. When programming memory cells to data state E, the system will test whether those memory cells have a threshold voltage greater than or equal to VvE. When programming memory cells to data state F, the system will test whether those memory cells have a threshold voltage greater than or equal to VvF. When programming memory cells to data state G, the system will test whether those memory cells have a threshold voltage greater than or equal to VvG. FIG. 5C also shows Vev, which is a voltage level to test whether a memory cell has been properly erased.

In an embodiment that utilizes full sequence programming, memory cells can be programmed from the erased data state Er directly to any of the programmed data states A-G using the process of FIG. 6 (discussed below). For example, a population of memory cells to be programmed may first be erased so that all memory cells in the population are in erased data state Er. Then, a programming process is used to program memory cells directly into data states A, B, C, D, E, F, and/or G. For example, while some memory cells are being programmed from data state ER to data state A, other memory cells are being programmed from data state ER to data state B and/or from data state ER to data state C, and so on. The arrows of FIG. 5C represent the full sequence programming. In some embodiments, data states A-G can overlap, with control die 211 and/or memory controller 120 relying on error correction to identify the correct data being stored. Note that in some embodiments, rather than using full sequence programming, the system can use multi-pass programming processes known in the art.

In general, during verify operations and read operations, the selected word line is connected to a voltage (one example of a reference signal), a level of which is specified for each read operation (e.g., see read compare levels VrA, VrB, VrC, VrD, VrE, VrF, and VrG, of FIG. 5C) or verify operation (e.g. see verify target levels VvA, VvB, VvC, VvD, VvE, VvF, and VvG of FIG. 5C) in order to determine whether a threshold voltage of the concerned memory cell has reached such level. After applying the word line voltage, the conduction current of the memory cell is measured to determine whether the memory cell turned on (conducted current) in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell. During a read or verify process, the unselected memory cells are provided with one or more read pass voltages (also referred to as bypass voltages) at their control gates so that these memory cells will operate as pass gates (e.g., conducting current regardless of whether they are programmed or erased).

There are many ways to measure the conduction current of a memory cell during a read or verify operation. In one example, the conduction current of a memory cell is measured by the rate it discharges or charges a dedicated capacitor in the sense amplifier. In another example, the conduction current of the selected memory cell allows (or fails to allow) the NAND string that includes the memory cell to discharge a corresponding bit line. The voltage on the bit line is measured after a period of time to see whether it has been discharged or not. Note that the technology described herein can be used with different methods known in the art for verifying/reading. Other read and verify techniques known in the art can also be used.

FIG. 5D depicts threshold voltage distributions when each memory cell stores four bits of data, which is another example of MLC data. FIG. 5D depicts that there may be some overlap between the threshold voltage distributions (data states) S0-S15. The overlap may occur due to factors such as memory cells losing charge (and hence dropping in threshold voltage). Program disturb can unintentionally increase the threshold voltage of a memory cell. Likewise, read disturb can unintentionally increase the threshold voltage of a memory cell. Over time, the locations of the threshold voltage distributions may change. Such changes can increase the bit error rate, thereby increasing decoding time or even making decoding impossible. Changing the read reference voltages can help to mitigate such effects. Using ECC during the read process can fix errors and ambiguities. Note that in some embodiments, the threshold voltage distributions for a population of memory cells storing four bits of data per memory cell do not overlap and are separated from each other. The threshold voltage distributions of FIG. 5D will include read reference voltages and verify reference voltages, as discussed above.

When using four bits per memory cell, the memory can be programmed using the full sequence programming discussed above, or multi-pass programming processes known in the art. Each threshold voltage distribution (data state) of FIG. 5D corresponds to predetermined values for the set of data bits. The specific relationship between the data programmed into the memory cell and the threshold voltage levels of the cell depends upon the data encoding scheme adopted for the cells. Table 3 provides an example of an encoding scheme for embodiments in which each bit of data of the four bits of data stored in a memory cell are in different logical pages, referred to as a lower page (LP), middle page (MP), an upper page (UP) and top page (TP).

TABLE 3

|    | S0 | S1 | S2 | S3 | S4 | S5 | S6 | S7 | S8 | S9 | S10 | S11 | S12 | S13 | S14 | S15 |
|----|----|----|----|----|----|----|----|----|----|----|-----|-----|-----|-----|-----|-----|
| TP | 1  | 1  | 1  | 1  | 1  | 0  | 0  | 0  | 0  | 0  | 1   | 1   | 0   | 0   | 0   | 1   |
| UP | 1  | 1  | 0  | 0  | 0  | 0  | 0  | 0  | 1  | 1  | 1   | 1   | 1   | 1   | 0   | 0   |
| MP | 1  | 1  | 1  | 0  | 0  | 0  | 0  | 1  | 1  | 0  | 0   | 0   | 0   | 1   | 1   | 1   |
| LP | 1  | 0  | 0  | 0  | 1  | 1  | 0  | 0  | 0  | 0  | 0   | 1   | 1   | 1   | 1   | 1   |

Figure 6:
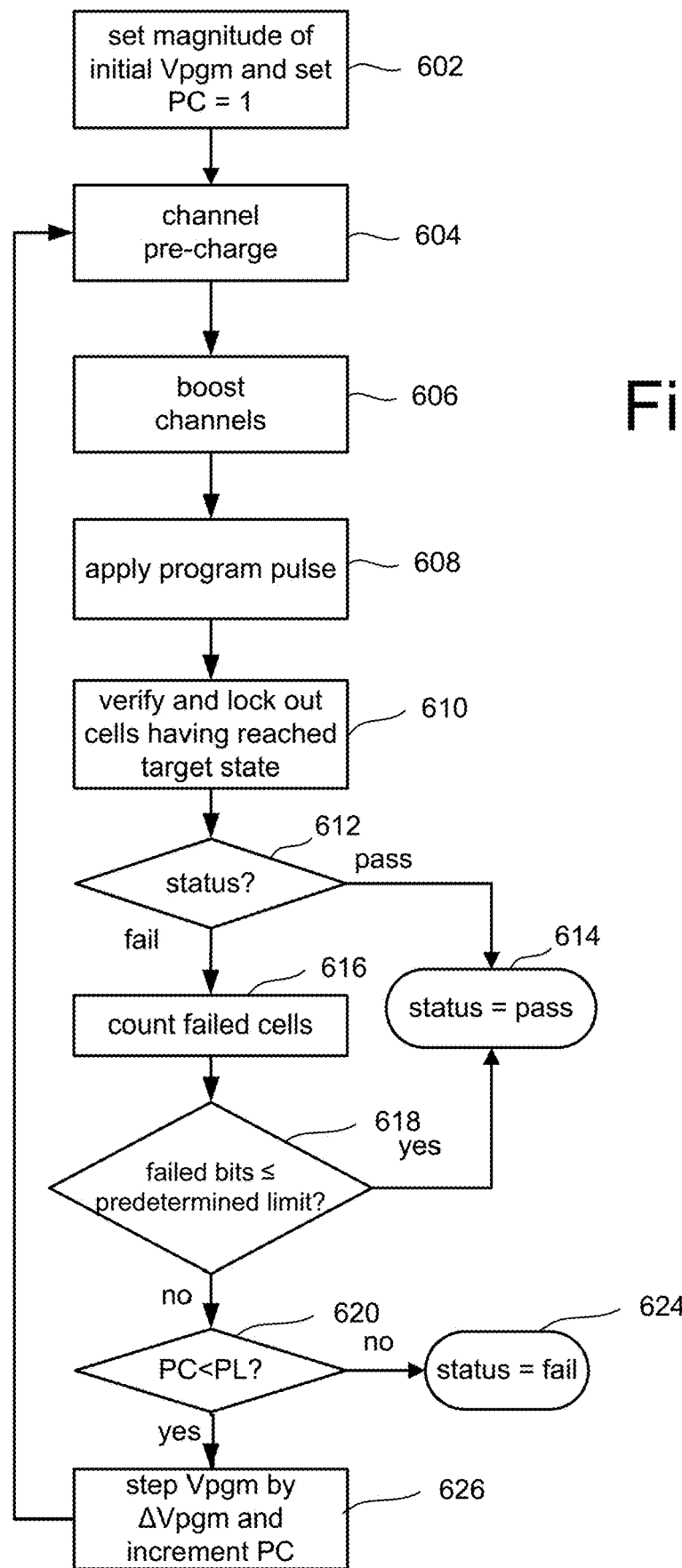
FIG. 6 is a flow chart describing one embodiment of a process for programming non-volatile memory.

FIG. 6 is a flowchart describing one embodiment of a process for programming memory cells. For purposes of this document, the term program and programming are synonymous with write and writing. In one example embodiment, the process of FIG. 6 is performed for memory array 202 using the one or more control circuits (e.g., system control logic 260, column control circuitry 210, row control circuitry 220) discussed above. In one example embodiment, the process of FIG. 6 is performed by integrated memory assembly 207 using the one or more control circuits (e.g., system control logic 260, column control circuitry 210, row control circuitry 220) of control die 211 to program memory cells on memory die 201. The process includes multiple loops, each of which includes a program phase and a verify phase. The process of FIG. 6 is performed to implement the full sequence programming, as well as other programming schemes including multi-stage programming. When implementing multi-stage programming, the process of FIG. 6 is used to implement any/each stage of the multi-stage programming process.

Typically, the program voltage applied to the control gates (via a selected data word line) during a program operation is applied as a series of program pulses (e.g., voltage pulses). Between programming pulses are a set of verify pulses (e.g., voltage pulses) to perform verification. In many implementations, the magnitude of the program pulses is increased with each successive pulse by a predetermined step size. In step 602 of FIG. 6, the programming voltage signal (Vpgm) is initialized to the starting magnitude (e.g., ~12-16V or another suitable level) and a program counter PC maintained by state machine 3262 is initialized at 1. In one embodiment, the group of memory cells selected to be programmed (referred to herein as the selected memory cells) are programmed concurrently and are all connected to the same word line (the selected word line). There will likely be other memory cells that are not selected for programming (unselected memory cells) that are also connected to the selected word line. That is, the selected word line will also be connected to memory cells that are supposed to be inhibited from programming. Additionally, as memory cells reach their intended target data state, they will be inhibited from further programming. Those NAND strings (e.g., unselected NAND strings) that include memory cells connected to the selected word line that are to be inhibited from programming have their channels boosted to inhibit programming. When a channel has a boosted voltage, the voltage differential between the channel and the word line is not large enough to cause programming. To assist in the boosting, in step 604 the control die will pre-charge channels of NAND strings that include memory cells connected to the selected word line that are to be inhibited from programming. In step 606, NAND strings that include memory cells connected to the selected word line that are to be inhibited from programming have their channels boosted to inhibit programming. Such NAND strings are referred to herein as "unselected NAND strings." In one embodiment, the unselected word lines receive one or more boosting voltages (e.g., ~7-11 volts) to perform boosting schemes. A program inhibit voltage is applied to the bit lines coupled the unselected NAND string.

In step 608, a program voltage pulse of the programming voltage signal Vpgm is applied to the selected word line (the word line selected for programming). If a memory cell on a NAND string should be programmed, then the corresponding bit line is biased at a program enable voltage. In step 608, the program pulse is concurrently applied to all memory cells connected to the selected word line so that all of the memory cells connected to the selected word line are programmed concurrently (unless they are inhibited from programming). That is, they are programmed at the same time or during overlapping times (both of which are considered concurrent). In this manner all of the memory cells connected to the selected word line will concurrently have their threshold voltage change, unless they are inhibited from programming.

In step 610, program verify is performed and memory cells that have reached their target states are locked out from further programming by the control die. Step 610 includes performing verification of programming by sensing at one or more verify reference levels. In one embodiment, the verification process is performed by testing whether the threshold voltages of the memory cells selected for programming have reached the appropriate verify reference voltage. In step 610, a memory cell may be locked out after the memory cell has been verified (by a test of the Vt) that the memory cell has reached its target state.

If, in step 612, it is determined that all of the memory cells have reached their target threshold voltages (pass), the programming process is complete and successful because all selected memory cells were programmed and verified to their target states. A status of "PASS" is reported in step 614. Otherwise if, in step 612, it is determined that not all of the memory cells have reached their target threshold voltages (fail), then the programming process continues to step 616.

In step 616, the number of memory cells that have not yet reached their respective target threshold voltage distribution are counted. That is, the number of memory cells that have, so far, failed to reach their target state are counted. This counting can be done by state machine 262, memory controller 120, or another circuit. In one embodiment, there is one total count, which reflects the total number of memory cells currently being programmed that have failed the last verify step. In another embodiment, separate counts are kept for each data state.

In step 618, it is determined whether the count from step 616 is less than or equal to a predetermined limit. In one embodiment, the predetermined limit is the number of bits that can be corrected by error correction codes (ECC) during a read process for the page of memory cells. If the number of failed cells is less than or equal to the predetermined limit, than the programming process can stop and a status of "PASS" is reported in step 614. In this situation, enough memory cells programmed correctly such that the few remaining memory cells that have not been completely programmed can be corrected using ECC during the read process. In some embodiments, the predetermined limit used in step 618 is below the number of bits that can be corrected by error correction codes (ECC) during a read process to allow for future/additional errors. When programming less than all of the memory cells for a page, or comparing a count for only one data state (or less than all states), than the predetermined limit can be a portion (pro-rata or not pro-rata) of the number of bits that can be corrected by ECC during a read process for the page of memory cells. In some embodiments, the limit is not predetermined. Instead, it changes based on the number of errors already counted for the page, the number of program-erase cycles performed or other criteria.

If the number of failed memory cells is not less than the predetermined limit, than the programming process continues at step 620 and the program counter PC is checked against the program limit value (PL). Examples of program limit values include 6, 12, 16, 19, 20 and 30; however, other values can be used. If the program counter PC is not less than the program limit value PL, then the program process is considered to have failed and a status of FAIL is reported in step 624. If the program counter PC is less than the program limit value PL, then the process continues at step 626 during which time the Program Counter PC is incremented by 1 and the programming voltage signal Vpgm is stepped up to the next magnitude. For example, the next pulse will have a magnitude greater than the previous pulse by a step size ΔVpgm (e.g., a step size of 0.1-1.0 volts). After step 626, the process loops back to step 604 and another program pulse is applied to the selected word line (by the control die) so that another iteration (steps 604-626) of the programming process of FIG. 6 is performed.

In one embodiment memory cells are erased prior to programming, and erasing is the process of changing the threshold voltage of one or more memory cells from a programmed data state to an erased data state. For example, changing the threshold voltage of one or more memory cells from state P to state E of FIG. 5A, from states A/B/C to state E of FIG. 5B, from states A-G to state Er of FIG. 5C or from states S1-S15 to state S0 of FIG. 5D.

One technique to erase memory cells in some memory devices is to bias a p-well (or other types of) substrate to a high voltage to charge up a NAND channel. An erase enable voltage (e.g., a low voltage) is applied to control gates of memory cells while the NAND channel is at a high voltage to erase the non-volatile storage elements (memory cells). Herein, this is referred to as p-well erase.

Another approach to erasing memory cells is to generate gate induced drain leakage (GIDL) current to charge up the NAND string channel. An erase enable voltage is applied to control gates of the memory cells, while maintaining the NAND string channel potential to erase the memory cells. Herein, this is referred to as GIDL erase. Both p-well erase and GIDL erase may be used to lower the threshold voltage (Vt) of memory cells.

In one embodiment, the GIDL current is generated by causing a drain-to-gate voltage at a select transistor (e.g., SGD and/or SGS). A transistor drain-to-gate voltage that generates a GIDL current is referred to herein as a GIDL voltage. The GIDL current may result when the select transistor drain voltage is significantly higher than the select transistor control gate voltage. GIDL current is a result of carrier generation, i.e., electron-hole pair generation due to band-to-band tunneling and/or trap-assisted generation. In one embodiment, GIDL current may result in one type of carriers, e.g., holes, predominantly moving into NAND channel, thereby raising potential of the channel. The other type of carriers, e.g., electrons, are extracted from the channel, in the direction of a bit line or in the direction of a source line, by an electric field. During erase, the holes may tunnel from the channel to a charge storage region of memory cells and recombine with electrons there, to lower the threshold voltage of the memory cells.

The GIDL current may be generated at either end of the NAND string. A first GIDL voltage may be created between two terminals of a select transistor (e.g., drain side select transistor) that is connected to or near a bit line to generate a first GIDL current. A second GIDL voltage may be created between two terminals of a select transistor (e.g., source side select transistor) that is connected to or near a source line to generate a second GIDL current. Erasing based on GIDL current at only one end of the NAND string is referred to as a one-sided GIDL erase. Erasing based on GIDL current at both ends of the NAND string is referred to as a two-sided GIDL erase.

Figure 7A:
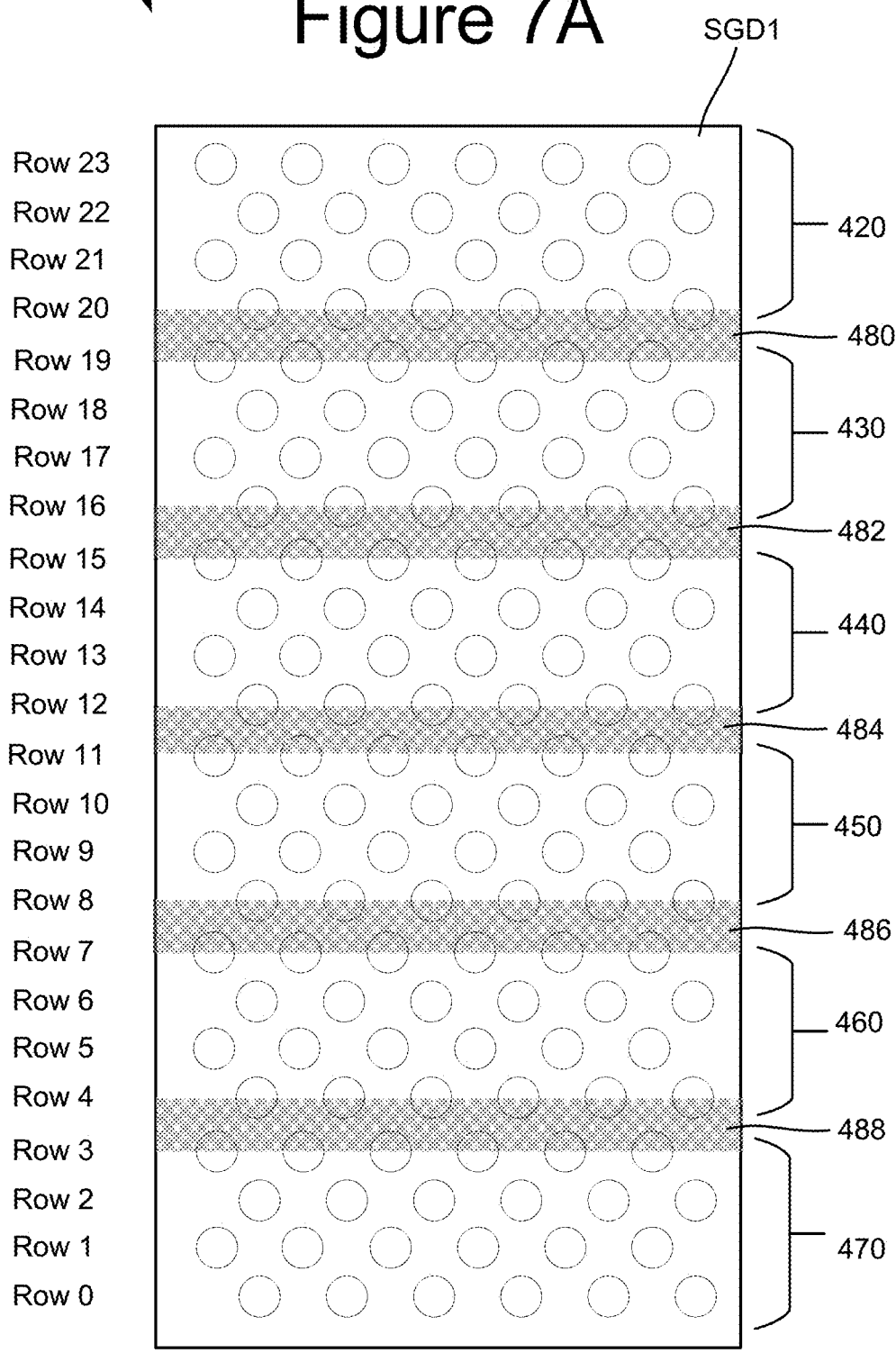
FIG. 7A depicts a top view of a select gate layer of a portion of one embodiment of a block of memory cells.

FIG. 7A is a block diagram depicting a top view of the SGD1 layer of the same portion 406 of Block 2 of plane 402 depicted in FIG. 4B. FIG. 7B is a block diagram depicting a top view of the WL239 layer (the top word line) of the same portion 406 of Block 2 of plane 402 depicted in FIGS. 4B and 7A. FIGS. 7A and 7B depict a plurality of circles that represent the vertical columns, which correspond to the memory holes and NAND strings, as discussed above. FIGS. 7A and 7B label the rows of vertical columns/NAND strings Row 0-Row 23. The block depicted in FIGS. 7A and 7B (as in FIG. 4B) is divided into six sub-bocks: 420, 430, 440, 450, 460 and 470 due to isolation regions 480, 482, 484, 486 and 488. As described above with respect to FIGS. 4D and 4E, isolation regions 480, 482, 484, 486 and 488 extend through SGD0, SGD1, SGD2 and DD0, but do not extend into WL0-WL239. Therefore, isolation regions 480, 482, 484, 486 and 488 are depicted extending through SGD1 in FIG. 7A but do not appear in FIG. 7B. FIG. 7A also shows (as discussed above) that the isolation regions 480, 482, 484, 486 and 488 intersect a subset of vertical columns/NAND strings. For example, isolation region 480 intersects the vertical columns/NAND strings of Row 19 and Row 20; isolation region 482 intersects the vertical columns/NAND strings of Row 15 and Row 16; isolation region 484 intersects the vertical columns/NAND strings of Row 11 and Row 12; isolation region 486 intersects the vertical columns/NAND strings of Row 7 and Row 8; and isolation region 488 intersects the vertical columns/NAND strings of Row 3 and Row 4.

FIG. 7B has been annotated with dashed line boxes to show on word line WL239 those vertical columns/NAND strings that intersect isolation regions. For example, box 702 surrounds vertical columns/NAND strings of Row 19 and Row 20; box 704 surrounds vertical columns/NAND strings of Row 19 and Row 20; box 706 surrounds vertical columns/NAND strings of Row 15 and Row 16; box 708 surrounds vertical columns/NAND strings of Row 11 and Row 14; box 710 surrounds vertical columns/NAND strings of Row 7 and Row 8; and 702 surrounds vertical columns/NAND strings of Row 3 and Row 4. For those vertical columns/NAND strings that intersect the isolation regions, a portion of the SGD select gates (e.g., transistors) will be cut out such that only a partial structure remains. In some embodiments, the partial structure remaining is semicircular in shape, as depicted in FIG. 4I. Ideally, the etching of the memory structure to add the isolation regions only cuts down to the DD0 layer (see FIGS. 4D and 4E). However, in some cases the etching may cut down to the DD1 layer. When the etching for the isolation regions gets close to the top/edge word line (e.g., Word line WL239), even if WL239 does not get etched, it has been discovered that memory cells connected to the top/edge word line (e.g., word line WL239) may experience degraded data retention characteristics (in some embodiments). That is, those memory cells may experience changes in threshold voltage over time that causes the data being stored to change (e.g., from one state to another state). This degradation of data retention characteristics is due to induced damage in WL239 from etching for the isolation regions, even if the etching does not cut away at any of WL239. Fortunately, this degradation of data retention characteristics only occurs on the top/edge word line (e.g., word line WL239) and not other data word lines (e.g., WL0-WL238). Additionally, this degradation of data retention characteristics is only experienced by memory cells connected to the top/edge word line of NAND strings that intersect isolation regions (e.g., NAND strings that have semicircular select gates because the NAND strings intersect the isolation regions). Memory cells connected to NAND strings that do not intersect isolation regions do not experience this phenomenon. For example, memory cells connected to WL239 that are on NAND strings of Row 19 may experience the above-described degradation of data retention characteristics. On the other hand, memory cells connected to WL239 that are on NAND strings of Row 18 do not experience the above-described degradation of data retention characteristics. Additionally, memory cells connected to WL0-WL238 that are on NAND strings of Row 19 do not experience the above-described degradation of data retention characteristics.

In one embodiment, the memory array 202 is configured to store three bits of data per memory cell. FIG. 5C depicts the three bits of data being programmed into 8 states (threshold voltage distributions). It has been determined that the above-described degradation of data retention characteristics due to the etching for the isolation regions materially effects those memory cells storing data in states F and G (see FIG. 5C). Those memory cells storing data in states Er-E are not affected by the above-described degradation of data retention characteristics due to the etching for the isolation regions. For memory cells storing four bits of data, the above-described degradation of data retention characteristics due to the etching for the isolation regions materially effects those memory cells storing data in states S11-S15 (see FIG. 5D). Those memory cells storing data in states S0-S10 are not affected by the above-described degradation of data retention characteristics due to the etching for the isolation regions. Memory cells storing two bits of data (see FIG. 5B) are not affected by the above-described degradation of data retention characteristics due to the etching for the isolation regions.

The above discussion teaches that memory cells connected to the top/edge word line (e.g., word line WL239) that are on NAND strings that intersect isolation regions (e.g., have semicircular select gates because the NAND strings intersect the isolation regions) may experience errors when storing three or four bits of data, but do not experience those errors when storing two bits of data. While a simple solution is to have the memory system only store two bits of data per memory cell, the loss of one bit per memory cell (e.g., for a system that could store three bits per memory cell) will significantly reduce the capacity of the memory system. Therefore, there is a need for the memory system to store three bits of data per memory cell without experiencing the above-described degradation of data retention characteristics due to the etching for the isolation regions.

In order to store three bits of data per memory cell without experiencing the above-described degradation of data retention characteristics due to the etching for the isolation regions, it is proposed to store variable bits of data per memory cell for memory cells connected to the top/edge word line (e.g., word line WL239). For example, in one embodiment memory cells connected to word lines other than the top/edge word line will store three bits per memory cell, memory cells connected to the top/edge word line and that are on NAND strings that intersect isolation regions (e.g., have semicircular select gates because the NAND strings intersect the isolation regions) will store two bits per memory cell, and memory cells connected to the top/edge word line and that are on NAND strings that do not intersect isolation regions (e.g., have circular select gates because the NAND strings do not intersect the isolation regions) will store four bits per memory cell. In this manner, the data stored in memory cells connected to the top/edge word line will average out to three bits per memory cell (e.g., half of the NAND strings will have memory cells storing two bits of data and half of the NAND strings will have memory cells storing four bits of data).

Other embodiments need not be limited to two, three and four bits of data per memory cell. For example, in one embodiment memory connected to word lines other than the top/edge word line will store x bits per memory cell, memory cells connected to the top/edge word line and that are on NAND strings that intersect isolation regions (e.g., have semicircular select gates because the NAND strings intersect the isolation regions) will store n bits per memory cell, and memory cells connected to the top/edge word line and that are on NAND strings that do not intersect isolation regions (e.g., have circular select gates because the NAND strings do not intersect the isolation regions) will store m bits per memory cell. In this manner, the data stored in memory cells connected to the top/edge word line will average out to x bits per memory cell (e.g., half of the NAND strings will have memory cells storing n bits of data and half of the NAND strings will have memory cells storing m bits of data), where m>x>n. In some embodiments, x is the average of m and n. This concept is depicted in FIGS. 8A and 8B.

Figure 8A:
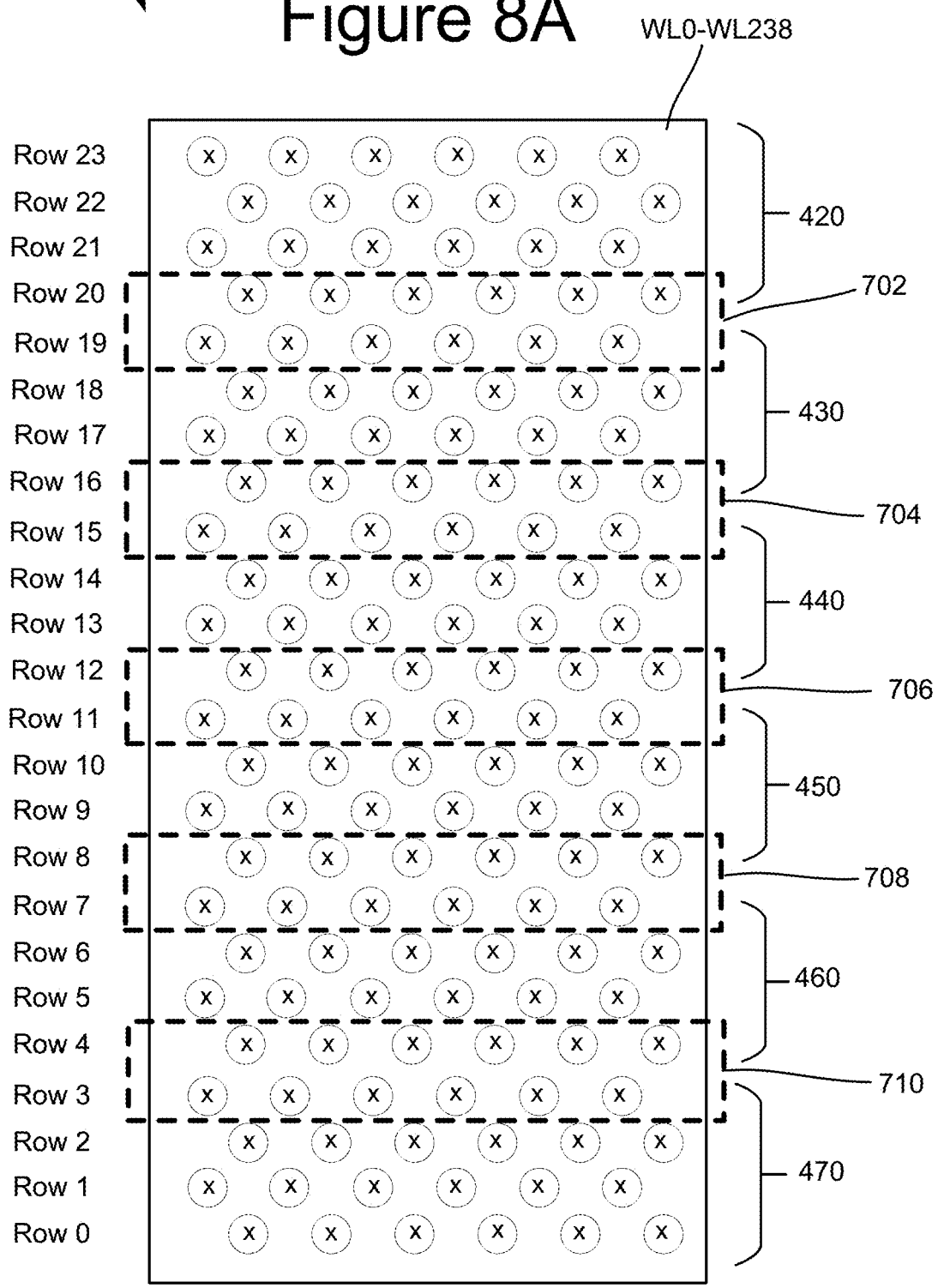
FIG. 8A depicts a top view of a word line layer of a portion of one embodiment of a block of memory cells.

FIG. 8A is a block diagram depicting a top view of the any of the WL0-WL238 layers of the same portion 406 of Block 2 of plane 402 depicted in FIGS. 4B, 7A and 7B. FIG. 8B is a block diagram depicting a top view of the WL239 layer (the top word line) of the same portion 406 of Block 2 of plane 402 depicted in FIGS. 4B, 7A, 7B and 8A. FIGS. 8A and 8B depict a plurality of circles that represent the vertical columns/NAND strings, as discussed above. Inside each of the circles is an indication of how many bits per memory cell will be stored in the memory cell at the WL layer depicted for the respective vertical column/NAND string. As can be seen from FIG. 8A, memory cells connected to word lines WL0-WL238 will store x bits per memory cell. As can be seen from FIG. 8B, memory cells connected to WL239 and that are on NAND strings in Row 3, Row 4, Row 7, Row 8, Row 11, Row 12, Row 15m Row 16, Row 19 and Row 20 will store n bits per memory cell; and memory cells connected to WL239 and that are in Row 1, Row 2, Row 5, Row 6, Row 9, Row 19, Row 13, Row 14, Row 17, Row 18, Row 21 and Row 22 will store m bits per memory cell. Note that memory cells connected to WL239 and that are on NAND strings in Row 0 and Row 23 will store n bits per memory cell so the data averages to three bite per memory cell.

Figure 9:
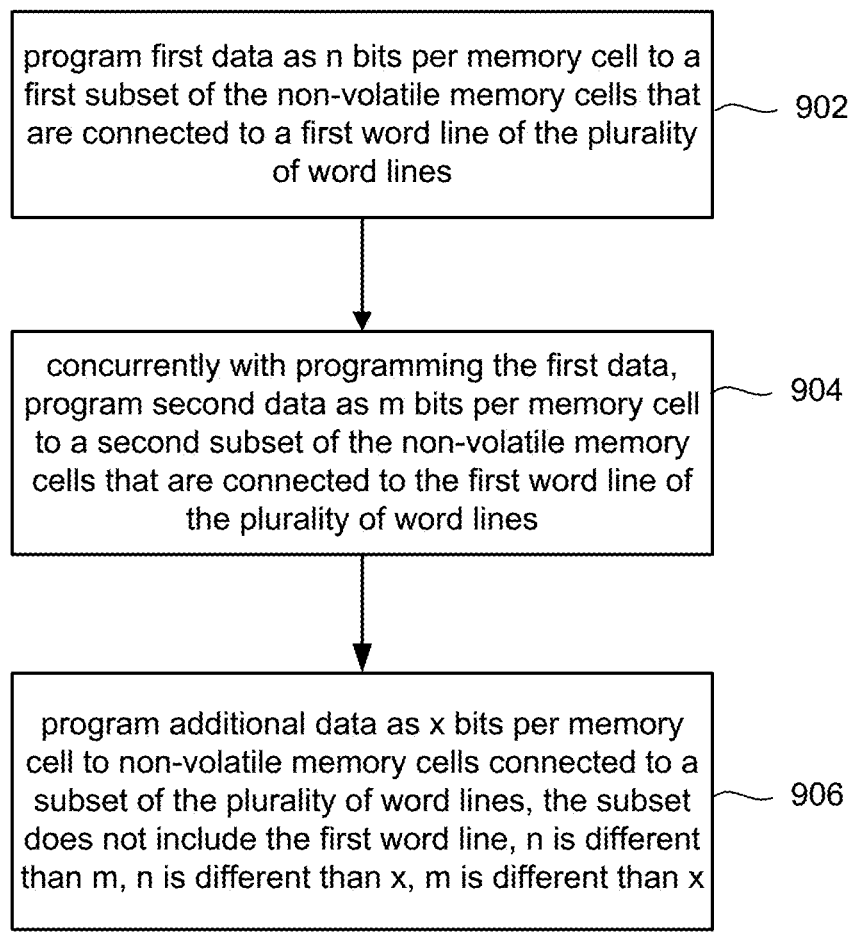
FIG. 9 is a flow chart describing one embodiment of a process for programming data.

FIG. 9 is a flow chart describing one embodiment for programming memory cells that includes storing variable bits of data per memory cell for memory cells connected to the top/edge word line. The flow chart of FIG. 9 implements the embodiment depicted in FIGS. 8A and 8B. The process of FIG. 9 can be performed by any one of the one or more control circuits discussed above. For example, the process of FIG. 9 can be performed by or at the direction of memory controller 120 and/or state machine 262 (and/or another processor). In some embodiments, the process of FIG. 9 is performed in the order depicted. In other embodiments, the process of FIG. 9 is performed in an order other than as depicted (e.g., see FIG. 13).

Step 902 of FIG. 9 includes programming first data as n bits per memory cell to a first subset of the non-volatile memory cells that are connected to a first word line of the plurality of word lines. For example, the process of FIG. 6 can be used to program n bits (e.g., two bits) of data per memory cell to memory cells connected to the top/edge word line (e.g., WL239) and that are on NAND strings that intersect isolation regions (e.g., NAND strings in Rows 3, 4, 7, 8, 11, 12, 15, 16, 19 and 20) and which have semicircular select gates.

Step 904 includes programming second data as m bits per memory cell to a second subset of the non-volatile memory cells that are connected to the first word line of the plurality of word lines. For example, the process of FIG. 6 can be used to program m bits (e.g., four bits) of data per memory cell to memory cells connected to the top/edge word line (e.g., WL239) and that are on NAND strings that do not intersect isolation regions (e.g., NAND strings in Rows 1, 2, 5, 6, 9, 10, 13, 14, 171, 18, 21 and 22) and have circular select gates. In one embodiment, step 904 is performed concurrently with performing step 902. That is, the first data is programmed to the first subset of the non-volatile memory cells concurrently with the second data being programmed to the second subset of the non-volatile memory cells.

Step 906 includes programming additional data as x bits per memory cell to non-volatile memory cells connected to a subset (e.g., WL0-WL238) of the plurality of word lines (WL0-WL239). For example, the process of FIG. 6 can be used to program x bits (e.g., three bits) of data per memory cell to memory cells connected to WL0-WL238. The subset (e.g., WL0-WL238) does not include the first word line (e.g., WL239). Additionally, n is different than m, n is different than x, and m is different than x.

In one embodiment, as described above, the plurality of non-volatile memory cells are in a block; the groups of connected non-volatile memory cells are vertical NAND strings in the block; each word line of the plurality of word lines is connected to all of the vertical NAND strings of the block; the block is divided into sub-blocks; the first subset of the non-volatile memory cells are part of NAND strings that intersect isolation regions between sub-blocks; and the second subset of the non-volatile memory cells are part of NAND strings that do not intersect any isolation regions between sub-blocks.

In one embodiment, as described above, the non-volatile memory cells are arranged as groups of connected non-volatile memory cells (e.g., NAND strings) such that each of the groups of connected non-volatile memory cells include a select gate; the plurality of non-volatile memory cells are positioned in a three dimensional memory structure that includes isolation regions that divide the three dimensional memory structure into sections that each include multiple groups of connected non-volatile memory cells; the isolation regions isolate select gates between sections; the first subset of the non-volatile memory cells are part of groups of connected non-volatile memory cells that intersect one the isolation regions; the first subset of the non-volatile memory cells are part of NAND strings having a select gate that is semicircular in shape; and the second subset of the non-volatile memory cells are part of NAND strings having a select gate that is circular in shape.

Figure 10:
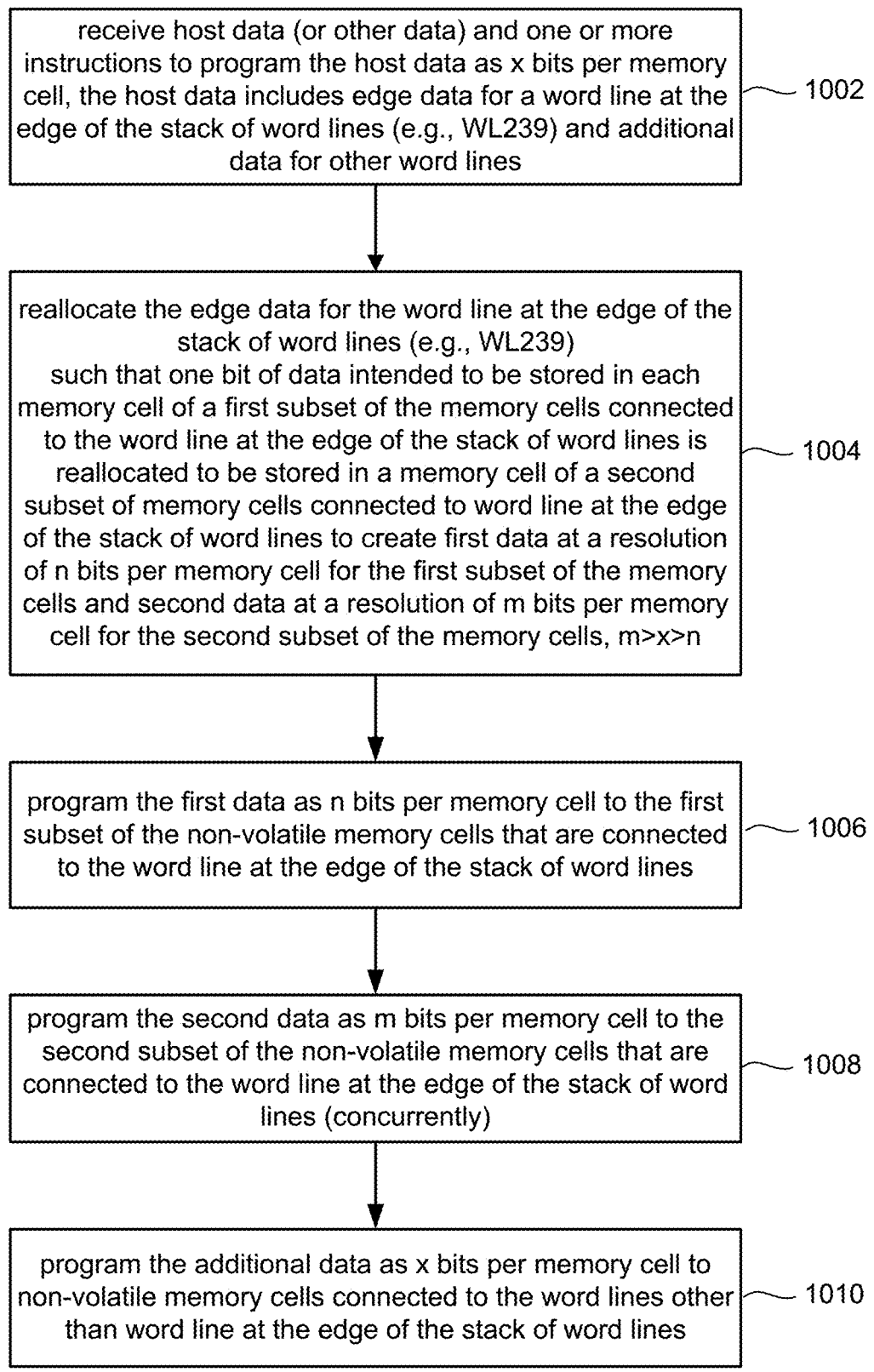
FIG. 10 is a flow chart describing one embodiment of a process for programming data.

FIG. 10 is a flow chart describing one embodiment for programming memory cells that includes storing variable bits of data per memory cell for memory cells connected to the top/edge word line. The flow chart of FIG. 10 implements the embodiment depicted in FIGS. 8A and 8B. The process of FIG. 10 can be performed by any one of the one or more control circuits discussed above. For example, the process of FIG. 10 can be performed by or at the direction of memory controller 120 and/or state machine 262 (and/or another processor). In some embodiments, the process of FIG. 10 is performed in the order depicted. In other embodiments, the process of FIG. 10 is performed in an order other than as depicted (e.g., see FIG. 13). The process of FIG. 10 is an example implementation of the process of FIG. 9.

In step 1002, host data (or other data) is received (or otherwise accessed) at memory die 200 (or the control die 211 of an integrated memory assemble 207). One or more instructions to program the host data as x bits per memory cell is/are also received. The host data includes edge data for the word line at the edge of the stack of word lines (e.g., WL239) and additional data for other word lines (e.g., WL0-WL238).

In step 1004, the edge data for the word line at the edge of the stack of word lines received in step 1002 is reallocated such that one bit of data intended to be stored in each memory cell of a first subset of the memory cells connected to the word line at the edge of the stack of word lines is reallocated to be stored in a memory cell of a second subset of memory cells connected to word line at the edge of the stack of word lines to create first data at a resolution of n bits per memory cell for the first subset of the memory cells and second data at a resolution of m bits per memory cell for the second subset of the memory cells, m>x>n. More details of step 1004 will be discussed below with respect to FIG. 11. Note that the edge data received in step 1004 can be considered fourth data at x bits per memory cell that is converted to the first data as n bits per memory cell and the second data as m bits per memory cell. In one embodiment, the first subset of the memory cells does not have any memory cells in common with the second subset of the memory cells.

In step 1006, the first data is programmed as n bits per memory cell to the first subset of the non-volatile memory cells that are connected to the word line at the edge of the stack of word lines. For example, the process of FIG. 6 can be used to program n bits (e.g., two bits) of data per memory cell to memory cells connected to the top/edge word line (e.g., WL239) and that are on NAND strings that intersect isolation regions (e.g., NAND strings in Rows 3, 4, 7, 8, 11, 12, 15, 16, 19 and 20) and have semicircular select gates.

In step 1008, the second data is programmed as m bits per memory cell to the second subset of the non-volatile memory cells that are connected to the word line at the edge of the stack of word lines. For example, the process of FIG. 6 can be used to program m bits (e.g., four bits) of data per memory cell to memory cells connected to the top/edge word line (e.g., WL239) and that are on NAND strings that do not intersect isolation regions (e.g., NAND strings in Rows 1, 2, 5, 6, 9, 10, 13, 14, 171, 18, 21 and 22) and have circular select gates. In one embodiment, step 1008 is performed concurrently with performing step 1006. That is, the first data is programmed to the first subset of the non-volatile memory cells concurrently with the second data being programmed to the second subset of the non-volatile memory cells.

In step 1010, the additional data is programmed as x bits per memory cell to non-volatile memory cells connected to the word lines other than word line at the edge of the stack of word lines. For example, the process of FIG. 6 can be used to program x bits (e.g., three bits) of data per memory cell to memory cells connected to WL0-WL238.

Figure 11:
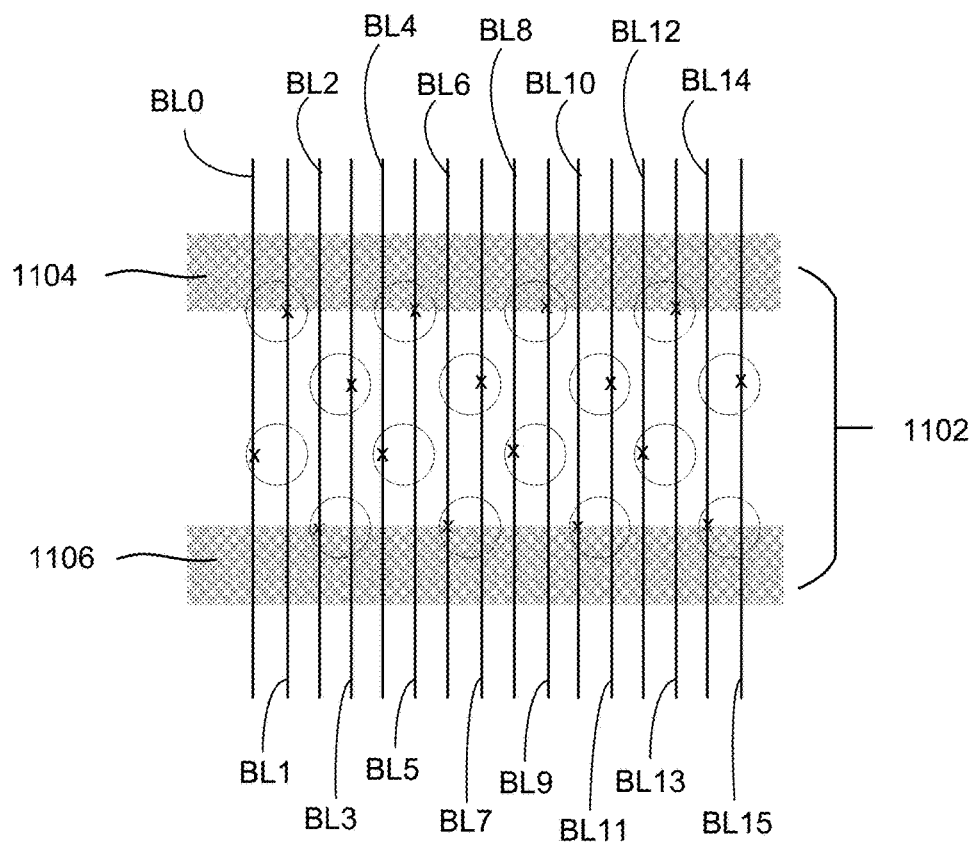
FIG. 11 depicts a top view of a portion of one embodiment of a block of memory cells and a table explaining one example of reallocating data among latches for the depicted portion of the block.

FIG. 11 describes one embodiment of reallocating the edge data (e.g., data intended for the word line at the edge of the stack of word lines) such that one bit of data intended to be stored in each memory cell of a first subset of the memory cells connected to the word line at the edge of the stack of word lines is reallocated to be stored in a memory cell of a second subset of memory cells connected to the word line at the edge of the stack of word lines to create first data at a resolution of n bits per memory cell for the first subset of the memory cells and second data at a resolution of m bits per memory cell for the second subset of the memory cells. Thus, FIG. 11 provides an example implementation of step 1004 of FIG. 10.

FIG. 11 includes a block diagram depicting a top view of a portion of a block of a memory array of memory cells, as described above. In one embodiment, the memory array has many layers; however, FIG. 11 only shows the top layer. FIG. 11 depicts a plurality of circles 1102 that represent the vertical columns/NAND strings (as described above) and a set of bit lines BL0, BL1, BL2, BL3, BL4, BL5, BL6, BL7, BL8, BL9, BL10, BL11, BL12, BL13, BL14, and BL15. FIG. 11 shows sixteen bit lines because only a portion of the block is depicted. Each of the circles representing vertical columns/NAND strings has an "x" to indicate its connection to one bit line. The portion of the block depicted in FIG. 11 includes isolation regions 1104 and 1106. Because only a portion of the block is depicted, only two of the isolation regions are depicted.

FIG. 11 also includes two tables (Table A and Table B) that show how data is stored in latches ADL, BDL, CDL and XDL (see FIG. 3) prior to programming for bit lines BL0-BL15. For example, after data is received in step 1002 and prior to the programming of steps 1006-1010, the data is stored in latches ADL, BDL, CDL and XDL. Tables A and B use upper case for lower page (LP), middle page (MP) and upper page (UP) data initially intended to be programmed into memory cells on NAND strings that do not intersect isolation regions and lower case for lower page (lp), middle page (mp) and upper page (up) for data initially intended to be programmed into memory cells on NAND strings that do intersect isolation regions.

Table A of FIG. 11 shows how data is stored in the latches for memory cells connected to WL238 (and all other word lines except WL239) as, for example, 3 bits per memory cell for each memory cell connected to WL238 regardless of whether the respective NAND string intersects an isolation region. That is, Table A depicts one embodiment in which three bits data to be stored in memory cells connected to WL238 (and all other word lines except WL239) are first loaded into the latches such that the lower page is loaded into ADL, the middle page is loaded into BDL and the upper page is loaded into CDL. From the latches ADL, BDL and CDL, the data is programmed into the memory cells as per the discussion above.

Table B of FIG. 11 shows one embodiment of how data is reallocated and stored in the latches for memory cells connected to WL239 as, for example 2 bits per memory cell or each memory cell connected to WL239 that are on NAND strings that intersect an isolation region and 4 bits per memory cell or each memory cell connected to WL239 that are on NAND strings that do not intersect an isolation region. For example, bit lines BL0, BL3, BL4, BL7, BL8, BL11, BL12 and BL15 are connected to NAND strings that do not intersect isolation regions 1104 and 1106; therefore, 3 bits of data intended for memory cells connected to those NAND strings are loaded into the latches such that lower page LP is loaded into ADL, the middle page MP is loaded into BDL and the upper page UP is loaded into CDL.

Bit lines BL1, BL2, BL4, BL5, BL6, BL9, BL10, BL13 and BL14 are connected to NAND strings that intersect isolation regions 1104 and 1106; therefore, the memory cells connected to those NAND strings and WL239 will store 2 bits of data each with the 2 bits of data loaded into the latches such that lower page lp is loaded into ADL and the middle page mp is loaded into BDL. The third bit of data (the upper page of data) that was intended to be stored in the memory cells connected to those NAND strings intersecting isolation regions and WL239 are reallocated (see arrows of Table B) to the XDL latch for NAND strings not intersecting isolation regions. For example, the upper page of data (up) intended to be stored in the memory cell connected to WL239 and on the NAND string connected BL1 is reallocated to the XDL latch for BL0, the upper page of data (up) intended to be stored in the memory cell connected to WL239 and on the NAND string connected BL2 is reallocated to the XDL latch for BL3, the upper page of data (up) intended to be stored in the memory cell connected to WL239 and on the NAND string connected BL5 is reallocated to the XDL latch for BL4, the upper page of data (up) intended to be stored in the memory cell connected to WL239 and on the NAND string connected BL6 is reallocated to the XDL latch for BL7, the upper page of data (up) intended to be stored in the memory cell connected to WL239 and on the NAND string connected BL9 is reallocated to the XDL latch for BL8, the upper page of data (up) intended to be stored in the memory cell connected to WL239 and on the NAND string connected BL10 is reallocated to the XDL latch for BL11, the upper page of data (up) intended to be stored in the memory cell connected to WL239 and on the NAND string connected BL13 is reallocated to the XDL latch for BL12, and the upper page of data (up) intended to be stored in the memory cell connected to WL239 and on the NAND string connected BL14 is reallocated to the XDL latch for BL15. Thus, FIG. 11 provides an example of the control circuit being configured to reallocate the data for WL239 by reallocating data intended for the CDL latches associated with a first subset of memory cells into the XDL latches associated with a second subset of memory. In this embodiment, the first data (see step 1006) includes the data in ADL and BDL for memory cells on NAND strings intersecting isolation regions and connected to WL239, and the second data (see step 1008) includes the data in ADL, BDL, CDL and XDL for memory cells on NAND strings not intersecting isolation regions and connected to WL239.

Figure 12:
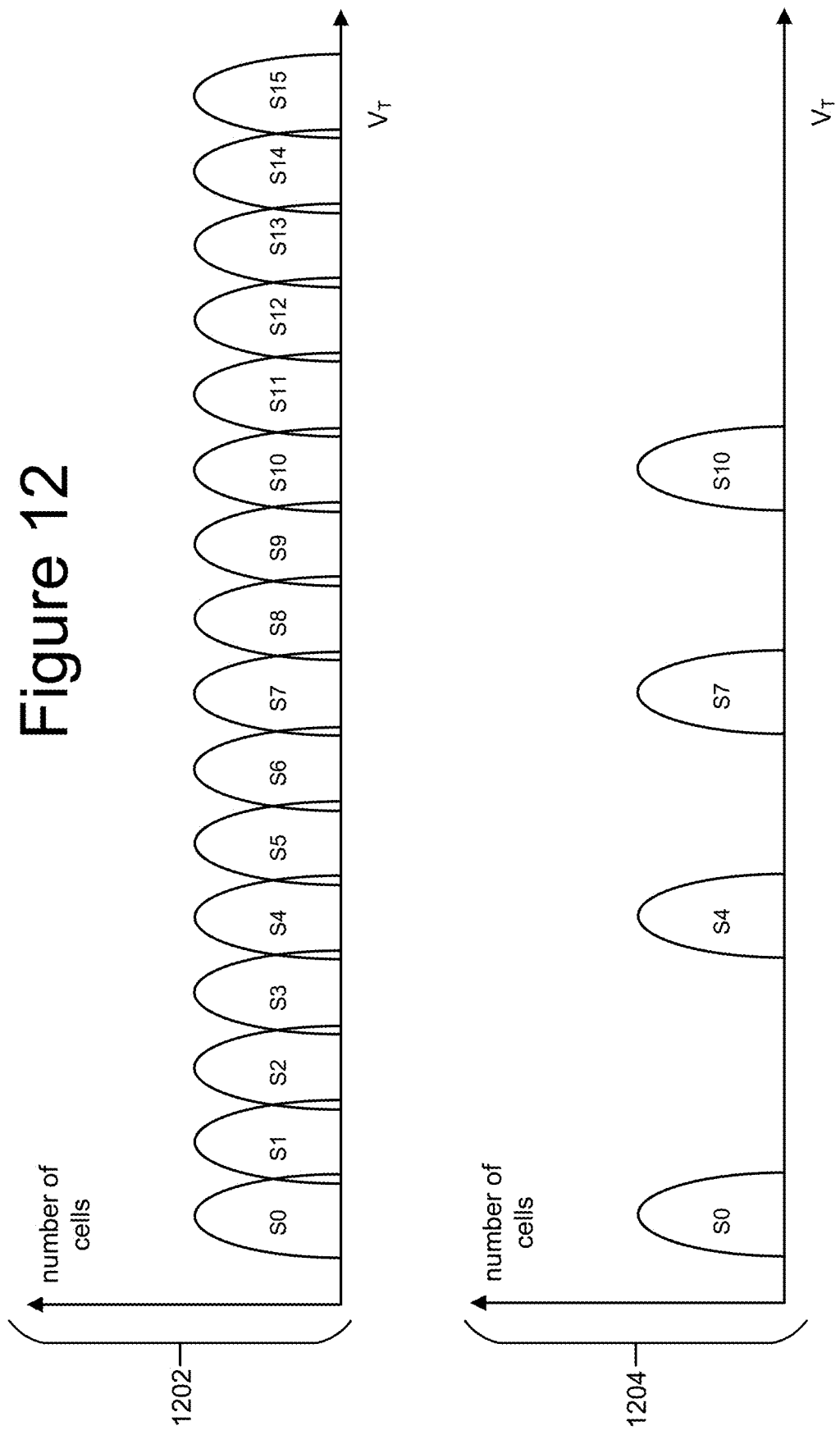
FIG. 12 depicts threshold voltage distributions.

FIG. 12 describes one embodiment for how to assign data states to the memory cells connected to WL239, which can be used as part of the implementation of the technology described in any of FIGS. 9-11. In the example where the memory cells connected to WL0-WL238 store three bits per memory cell, those memory cells store data in the eight data states depicted in FIG. 5C. Those memory cells connected to WL239 that are on NAND strings that do not intersect isolation regions will store four bits of data in sixteen data states of graph 1202 of FIG. 12 (which matches FIG. 5D). Those memory cells connected to WL239 that are on NAND strings that intersect isolation regions will store two bits of data in four data states of graph 1204 of FIG. 12, which in one embodiment include states S0, S4, S7 and S10. Thus, states S0, S4, S7 and S10 are included on both graphs 1202 and 1204, and are used by both sets of memory cells in order to simplify the implementation of the programming process.

Figure 13:
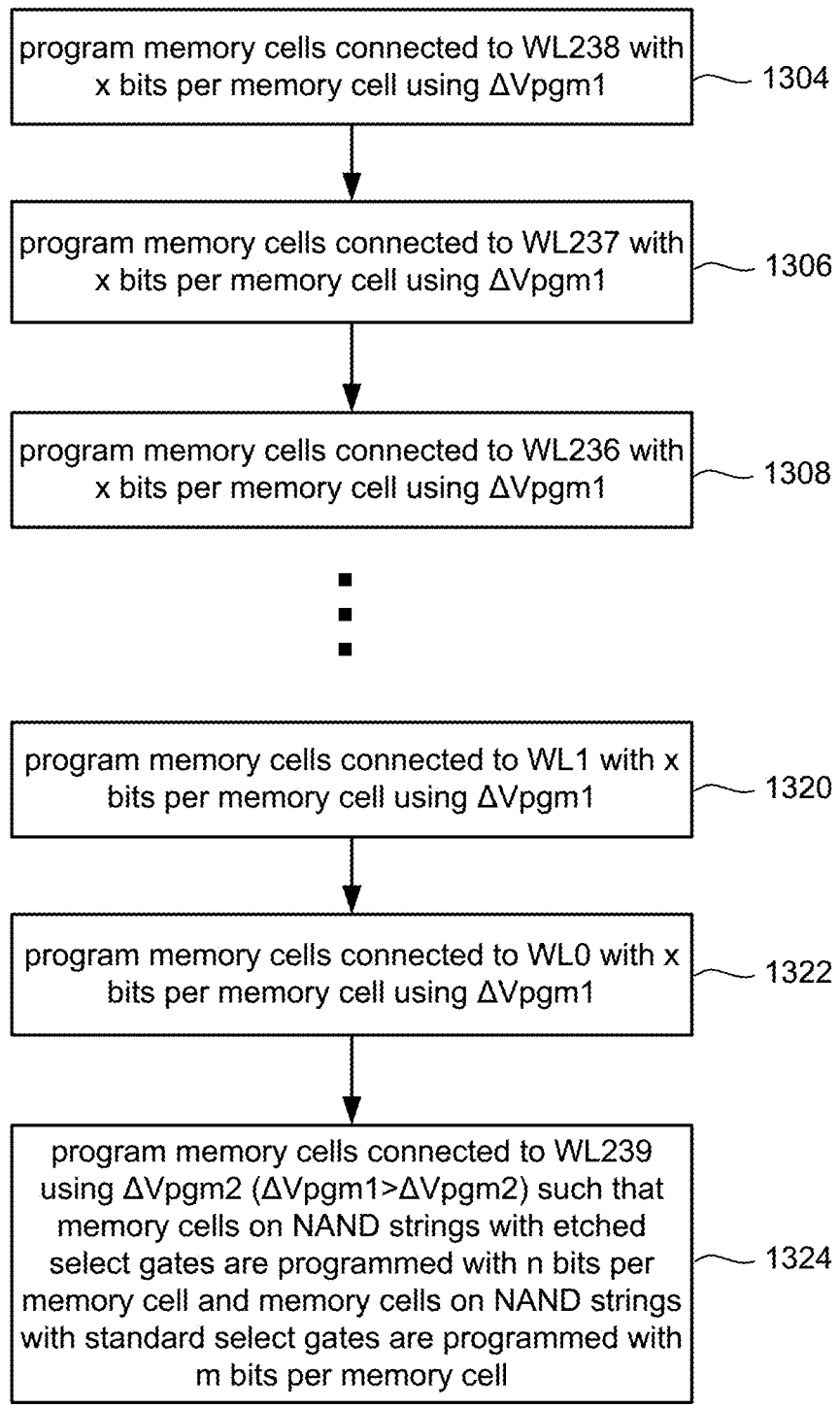
FIG. 13 is a flow chart describing one embodiment of a process for programming data.

FIG. 13 is a flow chart describing one embodiment for programming memory cells (e.g., on the vertical NAND strings discussed above) that includes storing variable bits of data per memory cell for memory cells connected to the top/edge word line. The flow chart of FIG. 13 implements the embodiment depicted in FIGS. 8A and 8B. The process of FIG. 13 is an example implementation of the process of FIG. 9 and an example implementation of the process of FIG. 10. The process of FIG. 13 assumes that the plurality of word lines form a vertical stack of word lines such that an edge/first/top word line (e.g., WL239) is at an edge of the vertical stack of word lines and a second word line (e.g., WL238) is adjacent the first word line.

The process of FIG. 13 can be performed by any one of the one or more control circuits discussed above. For example, the process of FIG. 13 can be performed by or at the direction of memory controller 120 and/or state machine 262 (and/or another processor). In one embodiment, the control circuit is configured to program the plurality of non-volatile memory cells in an order comprising programming memory cells connected to the second word line (e.g., WL238) followed by programming memory cells connected to a next lower word line (e.g., WL237) and repeating programming memory cells connected to a next lower word line (e.g., WL236, WL235, . . . ) until completing programming of memory cells connected to a bottom word line (e.g., WL0). After completing programming of memory cells connected to the bottom word line, the control circuit is configured to perform the programming for the memory cells connected to the edge/first word line (e.g., WL239). Programming in the order depicted in FIG. 13 helps reduce interference from neighboring word lines that could be experienced by memory cells connected to the edge/first word line (e.g., WL239). That is, since the edge/first word line is programmed last, it will not be disturbed by the programming of data to memory cells connected to other word lines of the block.

In step 1304, memory cells connected to WL238 are programmed with x bits per memory cell. One embodiment of step 1304 includes performing the process of FIG. 6 using a default step size for Vpgm in step 626 of FIG. 6. This default step size is referred to as $\Delta$Vpgm1 (e.g., 0.2 v). The programming in step 1304 implements the scheme depicted in FIG. 8A.

In step 1306, memory cells connected to WL237 are programmed with x bits per memory cell. One embodiment of step 1306 includes performing the process of FIG. 6 using the default step size $\Delta$Vpgm1 in step 626 of FIG. 6. The programming in step 1306 implements the scheme depicted in FIG. 8A.

In step 1308, memory cells connected to WL236 are programmed with x bits per memory cell. One embodiment of step 1308 includes performing the process of FIG. 6 using the default step size $\Delta$Vpgm1 in step 626 of FIG. 6. The programming in step 1308 implements the scheme depicted in FIG. 8A. The same process performed in step 1308 is performed for WL235-WL2.

In step 1320, memory cells connected to WL1 are programmed with x bits per memory cell. One embodiment of step 1320 includes performing the process of FIG. 6 using the default step size $\Delta$Vpgm1 in step 626 of FIG. 6. The programming in step 1320 implements the scheme depicted in FIG. 8A.

In step 1322, memory cells connected to WL0 are programmed with x bits per memory cell. One embodiment of step 1320 includes performing the process of FIG. 6 using the default step size $\Delta$Vpgm1 in step 626 of FIG. 6. The programming in step 1320 implements the scheme depicted in FIG. 8A. In one embodiment, steps 1304-1322 are an example implementation of step 906 of FIG. 9 and/or step 1010 of FIG. 10.

In step 1324, memory cells connected to WL239 are programmed such that memory cells on NAND strings with etched select gates (e.g., semicircular select gates because the NAND strings intersect the isolation regions) are programmed with n bits per memory cell and memory cells on NAND strings with standard select gates (e.g., circular select gates because the NAND strings do not intersect the isolation regions) are programmed with m bits per memory cell. The programming in step 1324 implements the scheme depicted in FIG. 8B. Step 1324 of FIG. 13 is an example implementation of steps 902 and 904 of FIG. 9 and/or steps 1006 and 1008 of FIG. 10.

One embodiment of step 1324 includes performing the process of FIG. 6 using a different step size $\Delta$Vpgm2 in step 626 of FIG. 6, such that $\Delta$Vpgm1>$\Delta$Vpgm2. The smaller step size (e.g., $\Delta$Vpgm2=0.1 v) is used on WL239 to provide greater precision for the programming of memory cells on WL239. Using a smaller step size slows down the programming, but since $\Delta$Vpgm2 is only being used for one word line out of 240 word lines, the extra time needed to program is small. Thus, in one embodiment depicted in FIG. 13, the control circuit is configured to program memory cells connected to the word lines WL0-WL238 using a plurality of voltage pulses that increase in magnitude by a first step size and program memory cells connected to the WL239 using a plurality of voltage pulses that increase in magnitude by a second step size, such that the first step size is greater in magnitude than the second step size.

FIG. 14 is a flow chart describing one embodiment of a process for reading data that has been programmed using the processes of FIGS. 9-13. The process of FIG. 14 can be performed by any one of the one or more control circuits discussed above. For example, the process of FIG. 14 can be performed by or at the direction of memory controller 120 and/or state machine 262 (and/or another processor). The process of FIG. 14 utilizes the components of FIG. 3 to perform the sensing.

In step 1402, the control circuit reads the first data as n bits per memory cell from the first subset of the non-volatile memory cells. For example, data is read from memory cells on NAND strings with etched select gates (e.g., semicircular select gates because the NAND strings intersect the isolation regions) that are connected to WL239.

In step 1404, the control circuit reads the second data as m bits per memory cell from the second subset of the non-volatile memory cells. For example, data is read from memory cells on NAND strings with standard select gates (e.g., circular select gates because the NAND strings do not intersect the isolation regions) that are connected to WL239.

In step 1406, the control circuit converts the first data as n bits per memory cell and the second data as m bits per memory cell to fourth data as x bits per memory cell. In step 1408, the control circuit reads the additional data as x bits per memory cell from the additional non-volatile memory cells. For example, data is read from memory cells connected to WL0-WL238. In step 1410, the data read is reported, for example, to a host.

A memory system has been described that protects the data on the top/edge word line such that memory cells on NAND strings with etched select gates (e.g., semicircular select gates because the NAND strings intersect the isolation regions) are programmed with less bits per memory cell than the nominal amount and memory cells on NAND strings with standard select gates (e.g., circular select gates because the NAND strings do not intersect the isolation regions) are programmed with more bits per memory cell than the nominal amount.

One embodiment includes a non-volatile storage apparatus comprising a plurality of non-volatile memory cells arranged as groups of connected non-volatile memory cells; a plurality of word lines, each word line of the plurality of word lines is connected to all of the groups of connected non-volatile memory cells; and a control circuit connected to the non-volatile memory cells and the word lines. The control circuit is configured to program first data as n bits per memory cell to a first subset of the non-volatile memory cells that are connected to a first word line of the plurality of word lines, program second data as m bits per memory cell to a second subset of the non-volatile memory cells that are connected to the first word line of the plurality of word lines, and program additional data as x bits per memory cell to non-volatile memory cells connected to a subset of the plurality of word lines, the subset does not include the first word line, n is different than m, n is different than x, m is different than x.

One embodiment includes a method of operating non-volatile storage, comprising: programming first data as n bits per memory cell to a first subset of non-volatile memory cells connected to a first word line; and concurrently with the programming of the first data to the first subset of non-volatile memory cells, programming second data as m bits per memory cell to a second subset of non-volatile memory cells connected to the first word line, n is different than m. One example implementation further comprises programming additional data as x bits per memory cell to a third subset of non-volatile memory cells connected to word lines other than the first word line, m>x>n.

One embodiment includes a non-volatile storage apparatus comprising: non-volatile memory cells; a stack of word lines connected to the memory cells, the stack of word lines includes a word line at the edge of the stack of word lines; and a control circuit connected to the memory cells and the word lines. The control circuit is configured to: receive host data and one or more instructions to program the host data as x bits per memory cell, the host data includes edge data for the word line at the edge of the stack of word lines and additional data for other word lines; reallocate the edge data for the word line at the edge of the stack of word lines such that one bit of data intended to be stored in each memory cell of a first subset of the memory cells connected to the word line at the edge of the stack of word lines is reallocated to be stored in a memory cell of a second subset of memory cells connected to word line at the edge of the stack of word lines to create first data at a resolution of n bits per memory cell for the first subset of the memory cells and second data at a resolution of m bits per memory cell for the second subset of the memory cells, m>x>n; program the first data as n bits per memory cell to the first subset of the non-volatile memory cells that are connected to the word line at the edge of the stack of word lines; program the second data as m bits per memory cell to the second subset of the non-volatile memory cells that are connected to the word line at the edge of the stack of word lines; and program the additional data as x bits per memory cell to non-volatile memory cells connected to the word lines other than word line at the edge of the stack of word lines.

In one example implementation, the control circuit comprises four latches per memory cell including first latches for data in a first page, second latches for data in a second page, third latches for data in a third page and fourth latches for data in a fourth page; and the control circuit is configured to reallocate the edge data by storing data intended for the third latches associated with the first subset of memory cells into the fourth latches associated with the second subset of memory cells.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via one or more intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. A non-volatile storage apparatus, comprising:
   a plurality of non-volatile memory cells arranged as groups of connected non-volatile memory cells;
   a plurality of word lines, each word line of the plurality of word lines is connected to all of the groups of connected non-volatile memory cells; and
   a control circuit connected to the non-volatile memory cells and the word lines, the control circuit is configured to:
      program first data as n bits per memory cell to a first subset of the non-volatile memory cells that are connected to a first word line of the plurality of word lines,
      program second data as m bits per memory cell to a second subset of the non-volatile memory cells that are connected to the first word line of the plurality of word lines, and
      program additional data as x bits per memory cell to non-volatile memory cells connected to a subset of the plurality of word lines, the subset does not include the first word line, n is different than m, n is different than x, m is different than x.

2. The non-volatile storage apparatus of claim 1, wherein:
   the control circuit is configured to program the first data as n bits per memory cell to the first subset of the non-volatile memory cells that are connected to the first word concurrently with programming the second data as m bits per memory cell to the second subset of the non-volatile memory cells that are connected to the first word line.

3. The non-volatile storage apparatus of claim 1, wherein the control circuit is configured to:
   receive host data and one or more instructions to program the host data as x bits per memory cell, the host data includes the additional data, the host data further includes first word line data to be stored as x bits per memory cell in memory cells connected to the first word line; and
   prior to the programming the first data and the programming the second data, reallocate the first word line data such that one bit of data intended to be stored in each memory cell of the first subset of the memory cells is reallocated to be stored in a memory cell of the second subset of memory cells to create the first data at a resolution of n bits per memory cell for the first subset of the memory cells and the second data at a resolution of m bits per memory cell for the second subset of the memory cells, wherein m>x>n.

4. The non-volatile storage apparatus of claim 3, wherein:
   the control circuit comprises four latches per memory cell including first latches for data in a first page, second latches for data in a second page, third latches for data in a third page and fourth latches for data in a fourth page; and
   the control circuit is configured to reallocate the first word line data by reallocating data intended for the third latches associated with the first subset of memory cells into the fourth latches associated with the second subset of memory cells.

5. The non-volatile storage apparatus of claim 1, wherein:
   the groups of connected non-volatile memory cells are vertical NAND strings;
   the plurality of word lines form a vertical stack of word lines such that the first word line is at an edge of the vertical stack of word lines, a second word line is adjacent the first word line; and
   the control circuit is configured to program the plurality of non-volatile memory cells in an order comprising programming memory cells connected to the second word line followed by programming memory cells connected to a next lower word line and repeating programming memory cells connected to a next lower word line until completing programming of memory cells connected to a bottom word line, after completing programming of memory cells connected to the bottom word line the control circuit is configured to perform the programming of the first data and the programming of the second data to the memory cells connected to the first word line.

6. The non-volatile storage apparatus of claim 1, wherein:
   the control circuit is configured to program memory cells connected to the subset of the plurality of word lines using a plurality of voltage pulses that increase in magnitude by a first step size; and
   the control circuit is configured to program memory cells connected to the first word line using a plurality of voltage pulses that increase in magnitude by a second step size, the first step size is greater in magnitude than the second step size.

7. The non-volatile storage apparatus of claim 1, wherein:
   the plurality of non-volatile memory cells are in a block;
   the groups of connected non-volatile memory cells are vertical NAND strings in the block; and
   each word line of the plurality of word lines is connected to all of the vertical NAND strings of the block.

8. The non-volatile storage apparatus of claim 7, wherein:
   the block is divided into sub-blocks;
   the first subset of the non-volatile memory cells are part of NAND strings that intersect isolation regions between sub-blocks; and
   the second subset of the non-volatile memory cells are part of NAND strings that do not intersect isolation regions between sub-blocks.

9. The non-volatile storage apparatus of claim 1, wherein the control circuit is configured to:
   access fourth data as x bits per memory cell; and
   convert the fourth data as x bits per memory cell to the first data as n bits per memory cell and the second data as m bits per memory cell.

10. The non-volatile storage apparatus of claim 1, wherein the control circuit is configured to:
    read the first data as n bits per memory cell from the first subset of the non-volatile memory cells;
    read the second data as m bits per memory cell from the second subset of the non-volatile memory cells; and convert the first data as n bits per memory cell and the second data as m bits per memory cell to fourth data as x bits per memory cell.

11. The non-volatile storage apparatus of claim 1, wherein:
    each of the groups of connected non-volatile memory cells include a select gate;
    the plurality of non-volatile memory cells are positioned in a three dimensional memory structure that includes isolation regions that divide the three dimensional memory structure into sections that each include multiple groups of connected non-volatile memory cells;
    the isolation regions isolate select gates between sections; and
    the first subset of the non-volatile memory cells are part of groups of connected non-volatile memory cells that intersect the isolation regions.

12. The non-volatile storage apparatus of claim 1, wherein:
    the groups of connected non-volatile memory cells are vertical NAND strings that each include a select gate region that form a select gate;
    the vertical NAND strings form a three dimensional memory structure that includes isolation regions that divide the three dimensional memory structure into sections that each include vertical NAND strings;
    the isolation regions isolate select gates between sections;
    the first subset of the non-volatile memory cells are part of NAND strings having a select gate section that intersects one the isolation regions; and
    the second subset of the non-volatile memory cells are part of NAND strings that do not intersect one the isolation regions.

13. The non-volatile storage apparatus of claim 1, wherein:
    the first subset of the non-volatile memory cells are part of NAND strings having a select gate that is semicircular in shape; and
    the second subset of the non-volatile memory cells are part of NAND strings having a select gate that is circular in shape.

14. The non-volatile storage apparatus of claim 1, wherein:
    m>x>n.

15. The non-volatile storage apparatus of claim 1, wherein:
    x is the average of m and n.

16. The non-volatile storage apparatus of claim 1, wherein:
    m=4, n=2 and x=3.

17. A method of operating non-volatile storage, comprising:
    programming first data as n bits per memory cell to a first subset of non-volatile memory cells connected to a first word line; and
    concurrently with the programming of the first data to the first subset of non-volatile memory cells, programming second data as m bits per memory cell to a second subset of non-volatile memory cells connected to the first word line, n is different than m.

18. The method of claim 17, further comprising:
    programming additional data as x bits per memory cell to a third subset of non-volatile memory cells connected to word lines other than the first word line, m>x>n.

19. A non-volatile storage apparatus, comprising:
    non-volatile memory cells;
    a stack of word lines connected to the memory cells, the stack of word lines includes a word line at the edge of the stack of word lines; and
    a control circuit connected to the memory cells and the word lines, the control circuit is configured to:
        receive host data and one or more instructions to program the host data as x bits per memory cell, the host data includes edge data for the word line at the edge of the stack of word lines and additional data for other word lines;
        reallocate the edge data for the word line at the edge of the stack of word lines such that one bit of data intended to be stored in each memory cell of a first subset of the memory cells connected to the word line at the edge of the stack of word lines is reallocated to be stored in a memory cell of a second subset of memory cells connected to word line at the edge of the stack of word lines to create first data at a resolution of n bits per memory cell for the first subset of the memory cells and second data at a resolution of m bits per memory cell for the second subset of the memory cells, m>x>n;
        program the first data as n bits per memory cell to the first subset of the non-volatile memory cells that are connected to the word line at the edge of the stack of word lines;
        program the second data as m bits per memory cell to the second subset of the non-volatile memory cells that are connected to the word line at the edge of the stack of word lines; and
        program the additional data as x bits per memory cell to non-volatile memory cells connected to the word lines other than word line at the edge of the stack of word lines.

20. The non-volatile storage apparatus of claim 19, wherein:
    the control circuit comprises four latches per memory cell including first latches for data in a first page, second latches for data in a second page, third latches for data in a third page and fourth latches for data in a fourth page; and
    the control circuit is configured to reallocate the edge data by storing data intended for the third latches associated with the first subset of memory cells into the fourth latches associated with the second subset of memory cells.

* * * * *